United States Patent
Santucci et al.

(10) Patent No.: US 9,461,676 B2
(45) Date of Patent: Oct. 4, 2016

(54) ENERGY EFFICIENT DISTRIBUTED ESTIMATION USING NONLINEAR AMPLIFIERS

(71) Applicants: Robert Santucci, Gilbert, AZ (US); Mahesh K. Banavar, Tempe, AZ (US); Andreas Spanias, Tempe, AZ (US); Cihan Tepedelenlioglu, Chandler, AZ (US)

(72) Inventors: Robert Santucci, Gilbert, AZ (US); Mahesh K. Banavar, Tempe, AZ (US); Andreas Spanias, Tempe, AZ (US); Cihan Tepedelenlioglu, Chandler, AZ (US)

(73) Assignee: Arizona Board of Regents, a body corporate of the State of Arizona, Acting for and on behalf of Arizona State University, Scottsdale, AZ (US)

( * ) Notice: Subject to any disclaimer, the term of this patent is extended or adjusted under 35 U.S.C. 154(b) by 82 days.

(21) Appl. No.: 14/213,624

(22) Filed: Mar. 14, 2014

(65) Prior Publication Data

US 2014/0269989 A1 Sep. 18, 2014

Related U.S. Application Data

(60) Provisional application No. 61/785,767, filed on Mar. 14, 2013.

(51) Int. Cl.
H04B 15/00 (2006.01)
H04B 1/04 (2006.01)

(52) U.S. Cl.
CPC .......... H04B 1/0475 (2013.01); H04B 1/0483 (2013.01); H04B 2001/0425 (2013.01)

(58) Field of Classification Search
CPC ............. H04L 25/4917; H04L 25/061; H04L 27/367; H04B 15/00
USPC .......................... 375/285, 296, 298; 370/252
See application file for complete search history.

(56) References Cited

U.S. PATENT DOCUMENTS

2002/0150171 A1* 10/2002 Myers ........................... 375/296
2005/0231279 A1* 10/2005 Moffatt et al. ................ 330/149
2013/0176872 A1* 7/2013 Stanczak et al. ............. 370/252

OTHER PUBLICATIONS

Zayani, Rafik, and Ridha Bouallegue. "Pre-distortion for the compensation of hpa nonlinearity with neural networks: Application to satellite communications." Int. J. Comput. Sci. Netw. Secur 7.3 (2007): 97-103.*
Cheong, M. Y., S. Werner, and T. I. Laakso. "Design of predistorters for power amplifiers in future mobile communications systems." Proceedings of the 6th Nordic Signal Processing Symposium-NORSIG. vol. 2004. 2004.*
M. Gastpar and M. Vetterli, "Power, spatio-temporal bandwidth, and distortion in large sensor networks," IEEE J. Sel. Areas Comm., vol. 23, No. 4, pp. 745-754, Apr. 2005.
M. Gastpar, "Uncoded transmission is exactly optimal for a simple Gaussian "sensor" network," IEEE Trans. Info. Theory, vol. 54, No. 11, pp. 5247-5251, Nov. 2008.
S. Cui, J. Xiao, A. Goldsmith, Z.-Q. Luo, and H. V. Poor, "Estimation diversity and energy efficiency in distributed sensing," IEEE Trans. Signal Proc., vol. 55, No. 9, pp. 4683-4695, Sep. 2007.

(Continued)

*Primary Examiner* — Daniel Washburn
*Assistant Examiner* — Fitwi Hailegiorgis
(74) *Attorney, Agent, or Firm* — Bryan Cave LLP

(57) ABSTRACT

Some embodiments include a distributed estimation system. Other embodiments of related systems and methods are also disclosed.

20 Claims, 13 Drawing Sheets

(56) References Cited

OTHER PUBLICATIONS

M. K. Banavar, C. Tependelenlioglu, and A. Spanias, "Estimation Over Fading Channels with Limited Feedback Using Distributed Sensing," IEEE Trans. on Signal Processing, vol. 58, No. 1, pp. 415-425, 2010.

M. K. Banavar, C. Tepedelenlioglu, and A. Spanias, "Distributed SNR Estimation with Power Constrained Signaling over Gaussian Multiple-Access Channels," IEEE Trans. Signal Proc, vol. 60, No. 6, pp. 3289-3294, Jun. 2012.

M. K. Banavar, A. D. Smith, C. Tepedelenlioglu and A. Spanias, "On the Effectiveness of Multiple Antennas in Distributed Detection over Fading MACs," IEEE Trans. on Wireless Comm, vol. 11, No. 5, pp. 1744-1752, 2012.

J. Cavers, "Amplifier linearization using a digital predistorter with fast adaptation and low memory requirements," IEEE Transactions on Vehicular Technology, vol. 39, No. 4, pp. 374-385, Nov. 1990.

S. Dasarathan and C. Tepedelenlioglu, "On Distributed Estimation and Detection with Bounded Transmissions over Gaussian Multiple Access Channels," IEEE Trans. on Signal Processing, IEEE Transactions on Signal Processing, vol. 62, No. 13, Jul. 1, 2014, pp. 3454-3463.

M. Rawat, K. Rawat and F. Ghannouchi, "Adaptive digital predistortion of wireless power amplifiers/transmitters using dynamic real-valued focused time-delay line neural networks," IEEE Trans. on Microwave Theory and Techniques, vol. 58, No. 1, pp. 95-104, 2010.

R. Santucci, M. Banavar, A. Spanias, and C. Tepedelenlioglu, "Estimation for Amplify-and-Forward Transmissions with Nonlinear Amplifiers," In Proceedings of 2013 Constantinides International Workshop on Signal Processing, 2013.

S. Dasarathan, "Distributed Inference Using Bounded Transmissions," Arizona State University, Tempe, PhD thesis, May 2013.

K. Gard, L. Larson, and M. Steer, "The Impact of RF Front-End Characteristics on the Spectral Regrowth of Commuinication Signals," IEEE Transactions on Microwave Theory and Techniques, vol. 53, No. 6, pp. 2179-2186, 2005.

Jin-Jun Xiao, Shuguang Cui, Zhi-Quan Luo, and A.J. Goldsmith, "Linear Coherent Decentralized Estimation," IEEE Transactions on Signal Processing, vol. 56, No. 2, pp. 757-770, Feb. 2008.

M Gastpar and M Vetterli, "Source-channel communication in sensor networks," in Proc.of 2nd International Workshop of Info Processing Sensor Networks, Palo Alto, 2003, pp. 162-177.

Alex Leong, Subrakanti Dey, and Jamie Evans, "Asymptotics and power allocation for state estimation over fading channels," IEEE Transactions on Aerospace and Electronic Systems, vol. 47, No. 1, pp. 611-633, Jan. 2011.

Visvakumar Aravinthan, Sudharman Jayaweera, and Kossai Al Tarazi, "Distributed Estimation in a Power Constrained Sensor Network," in IEEE Vehicular Technology Conference, vol. 3, Melbourne, pp. 1048-1052, 2006.

C. Tepedelenlioglu, M. Banavar, and A. Spanias, "On the Asymptotic Efficiency of Distributed Estimation Systems With Constant Modulus Signals Over Multiple-Access Channels," IEEE Transactions on Information Theory, vol. 57, No. 10, pp. 7125-7130, Oct. 2011.

C. Tepedelenlioglu and A. Narasimhamhurthy, "Universal Distributed Estimation Over Multiple Access Channels With Constant Modulus Signaling" IEEE Transactions on Signal Processing, vol. 58, No. 9, pp. 4783-4794, Sep. 2010.

R. Mudumbai, G. Barriac, and U. Madhow, "On the feasibility of distributed beamforming in wireless networks," IEEE Transactions on Wireless Communications, vol. 6, No. 5, pp. 1754-1763, May 2007.

J. A. Bucklew and W. A. Sethares, "Convergence of a class of decentralized beamforming algorithms," IEEE Transactions on Signal Processing, vol. 56, No. 6, pp. 2280-2288, Jun. 2008.

W. Li and H. Dai, "Distributed detection in wireless sensor networks using a multiple access channel," IEEE Transactions on Signal Processing, vol. 55, No. 3, pp. 822-833, Mar. 2007.

J. C. Pedro and S. A. Maas, "A comparative overview of microwave and wireless power-amplifier behavioral modeling approaches," IEEE Transactions on Microwave Theory and Techniques, vol. 53, No. 4, pp. 1150-1163, 2005.

A. J. Cann, "Nonlinearity Model with Variable Knee Sharpness," IEEE Transactions on Aerospace and Electronic Systems, vol. 16, No. 6, pp. 874-877, 1980.

J.H. Van Vleck and D. Middleton, "The spectrum of clipped noise," Proceedings of the IEEE, vol. 54, No. 1, pp. 2-19, 1966.

R. Santucci and A. Spanias, "Block Adaptive and Neural Network based Digital Predistortion and Power Amplifier Performance," in Proc. of IASTED Signal Processing, Pattern Recognition, and Applications, Innsbruck, 2011.

K.J. Muhonen, M. Kavehrad, and R. Krishnamoorthy, "Look-up table techniques for adaptive digital predistortion: a development and comparison," IEEE Transactions on Vehicular Technology, vol. 49, No. 5, pp. 1995-2002, 2000.

B. Widrow, J. McCool, and M. Ball, "The Complex LMS Algorithm," Proceedings of the IEEE, vol. 63, No. 4, pp. 719-720, Apr. 1975.

28. R. Santucci and A. Spanias, "A block adaptive predistortion algorithm for transceivers with long transmit-receive latency ," in 2010 4th International Symposium on Communications, Control and Signal Processing (ISCCSP), Limassol, 2011.

P. Jardin and G. Baudoin, "Filter Lookup Table Method for Power Amplifier Linearization," IEEE Transactions on Vehicular Technology, vol. 56, No. 3, pp. 1076-1087, 2007.

M.T. Hagan and M.B Menhaj, "Training feedforward networks with the Marquardt algorithm," IEEE Transactions on Neural Networks, vol. 5, No. 6, pp. 989-993, 1994.

Robert Santucci, Mahesh K. Banavar, Andreas Spanias, Cihan Tepedelenlioglu "Design of Limiting Amplifier Models for Nonlinear Amplify-and-Forward Distributed Estimation", 18th International Conference on Digital Signal Processing (DSP), pp. 1-6, Jul. 1-3, 2013.

Robert Santucci, Mahesh K. Banavar, Andreas Spanias, Cihan Tepedelenlioglu , "Energy-Efficient Distributed Estimation by Utilizing a Nonlinear Amplifier", IEEE Transactions on Circuits and Systems—I: Regular Papers, vol. 61, No. 1, pp. 302-311 , Jan. 2014.

R. Santucci, "Energy-Efficient Distributed Estimation by Utilizing a Nonlinear Amplifier", PhD Thesis, Arizona State University, Nov. 2013.

S. Shah & B. Beferul-Lozano, "In-Network Iterative Distributed Estimation for Power-constrained Wireless Sensor Networks", 8th International Conference on Distributed Computing in Sensor Systems, pp. 239-246, 2012.

R. Zayani & R. Bouallegue, "Pre-Distortion for teh compensation of HPA nonlinearity with neural networks: Application to satellite communications", Int. J. Comput. Sci, Netw. Secure 7.3 (2007) 97-103.

M.Y. Cheoung et al., "Design of predistortion for power amplifiers in future mobile communications systems", Proceedings of the 6th Nordic Signal Processing Symposium-NORSIG. vol. 2004. 2004.

* cited by examiner

ENERGY EFFICIENT DISTRIBUTED ESTIMATION USING NONLINEAR AMPLIFIERS

CROSS-REFERENCE TO RELATED APPLICATIONS

This application claims the benefit of U.S. Provisional Application No. 61/785,767, filed Mar. 14, 2013. U.S. Provisional Application No. 61/785,767 is incorporated herein by reference in its entirety.

TECHNICAL FIELD

This disclosure relates generally to distributed estimation systems, and relates more particularly to amplify-and-forward distributed estimation systems.

BACKGROUND

In certain types of distributed estimation, a large number of inexpensive sensors are scattered, measuring a desired quantity, $\theta$, and transmitting the measurement back to a fusion center (FC), where these measurements are fused into a single estimate, $\hat{\theta}$. An example of such a scenario is surveillance in an inaccessible area: sensors are airdropped into a region and there is a fusion center in the area. The sensors measure some physical quantity in the presence of noise. In this or other mobile low-power sensor network applications, power efficiency is a key design attribute influencing usability of the system.

There are a variety of ways to transmit the data from each sensor to the fusion center. Each individual sensor can transmit its data to the fusion center using an orthogonal signaling scheme, which makes each sensor's measurement independently discernible, but also requires a total system bandwidth that grows with the total number of sensors. This increasing bandwidth requirement limits the attainable sensor sampling rate. This may be acceptable if the number of sensors is small, but may not be applicable when the number of sensors is large. A different technique is to use an estimation algorithm which does not need to attain the values of individual sensor measurements orthogonally, but instead operates on an aggregate received value. One estimation algorithm that can operate using a shared bandwidth is Amplify-and-forward (AF).

An assumption made in AF systems is that the transmitter is either inherently linear or has been linearized by a predistorter. Though linearity is desirable for producing accurate estimates, it significantly reduces the power efficiency of the transmitting sensors. Many papers have been published on boosting the energy-efficiency of wireless sensor networks at the system-level by optimally allocating transmitted output power among the sensors, but none examines the battery power required to generate the output.

BRIEF DESCRIPTION OF THE DRAWINGS

To facilitate further description of the embodiments, the following drawings are provided in which.

Figure 1:
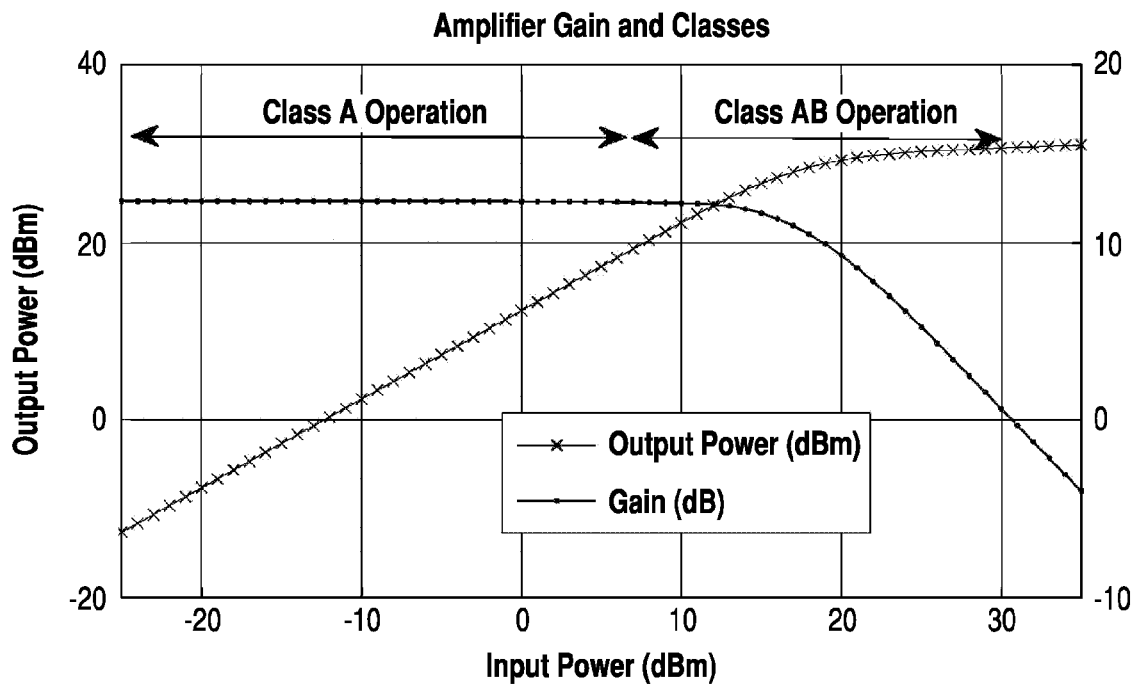
FIG. 1 illustrates a Class AB amplifier with non-constant gain.

For simplicity and clarity of illustration, the drawing figures herein illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically or otherwise. Two or more electrical elements may be electrically coupled, but not mechanically or otherwise coupled; two or more mechanical elements may be mechanically coupled, but not electrically or otherwise coupled; two or more electrical elements may be mechanically coupled, but not electrically or otherwise coupled. Coupling (whether mechanical, electrical, or otherwise) may be for any length of time, e.g., permanent or semi permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types. The absence of the word "removably," "removable," and the like near the word "coupled," and the like does not mean that the coupling, etc. in question is or is not removable.

DESCRIPTION OF EXAMPLES OF EMBODIMENTS

A number of embodiments include a distributed estimation system. The distributed estimation system includes a plurality of sensors each including a predistorter system and a transmitter. The distributed estimation system also include a fusion center including a receiver and an estimator. Each sensor of the plurality of sensors measures a parameter in the presence of sensing noise to detect a parameter signal. Each predistorter system has a filter having a predistortion function that is tuned to match a gain output of the predistorter system to a nonlinear function instead of a linear gain Each predistorter system predistorts the parameter signal to produce a transmission signal having a nonlinear gain. Each transmitter wirelessly transmits the transmission signal over a wireless multiple-access communication channel to the receiver of the fusion center. The transmitter that wirelessly transmits and the predistorter that produced the transmission signal are part of a common sensor of the plurality of sensors. The receiver receives a received signal. The received signal includes an aggregation of each of the transmission signals sent by the transmitters of the plurality of sensors. The estimator converts the received signal based at least in part on an inversion of the nonlinear function to produce an average parameter estimate.

Various embodiments includes a method of performing distributed estimation using a plurality of sensors and a fusion center. The method includes measuring at each sensor of the plurality of sensors a parameter in the presence of sensing noise to detect a parameter signal. The method also includes predistorting the parameter signal with a predistortion function that is tuned to match a gain output to a nonlinear function instead of a linear gain, to produce a transmission signal. The method also includes, for each sensor, transmitting the transmission signal from the sensor that measured the parameter, over a wireless multiple-access communication channel, to the fusion center. The fusion center receives a received signal comprising an aggregation of each of the transmission signals sent by the plurality of sensors. The method also includes converting the received signal based at least in part on an inversion of the nonlinear function to produce an average parameter estimate.

Several embodiments include a method of providing a distributed estimation system. The method includes providing a plurality of sensors. Each sensor includes a predistorter system and a transmitter. The method also includes providing a fusion center including a receiver and an estimator. Each sensor of the plurality of sensors measures a parameter in the presence of sensing noise to detect a parameter signal. Each predistorter system has a filter having a predistortion function that is tuned to match a gain output of the predistorter system to a nonlinear function instead of a linear gain. Each predistorter system predistorts the parameter signal to produce a transmission signal having a nonlinear gain. Each transmitter wirelessly transmits the transmission signal over a wireless multiple-access communication channel to the receiver of the fusion center. The transmitter that wirelessly transmits and the predistorter that produced the transmission signal are part of a common sensor of the plurality of sensors. The receiver receives a received signal. The received signal includes an aggregation of each of the transmission signals sent by the transmitters of the plurality of sensors. The estimator converts the received signal based at least in part on an inversion of the nonlinear function to produce an average parameter estimate.

Nonlinear transmitter configurations may be designed such that sensor efficiency is improved, but this design can require significant changes to the estimator. The predistortion function can be tuned in a unique manner to improve efficiency. Estimators can be provided for use with the predistorted amplifiers. The performance can be analyzed theoretically and with simulations in terms of asymptotic variance and power added efficiency (PAE), and the effect of the tuned predistortion function on performance can be characterized.

The key component in a transmitter that affects its linearity is the power amplifier (PA). PA design involves a tradeoff between linearity and efficiency. When designing a PA, there are two components of current: bias current and signal current. Bias current is a generally constant current used to establish the baseline operating point of the transistors in the amplifier. Bias current does not produce any output signal power, and hence reduces efficiency. Signal current is induced by the changes in transistor conductance resulting from a time-varying signal input to the amplifier. The actual transistor operating point, and hence instantaneous gain of the amplifier, is determined by the sum of bias and signal currents. If the constant bias current is much larger than the varying signal current, the transistor operating point will remain nearly constant and hence the amplifier gain will be nearly constant or "linear". FIG. 1 shows a class AB amplifier with non-constant gain. Provided the transistor is in the active region, this small input-signal constant-gain operation is known as "Class A", as shown in FIG. 1.

More efficient amplifiers can be designed by reducing the fraction of total current spent biasing the amplifier. In a class AB amplifier, the bias current is reduced such that the signal current drives the transistor out of its active region for a portion of its sinusoidal cycle, which leads to signal clipping. The fraction of a cycle spent in clipping is a function of the signal current, and thus the input signal amplitude. Additionally, because the sinusoid is clipped, energy is introduced at the harmonics. In some embodiments, for a single-tone sinusoidal input, these harmonics can be filtered away leaving only a pure sinusoid at the fundamental frequency. Due to the differences in percent of the cycle clipped, the amplifier gain at the fundamental frequency becomes a decreasing or compressive function of the amplifier input magnitude, making the amplifier nonlinear as shown in the class AB region of FIG. 1.

Figure 2:
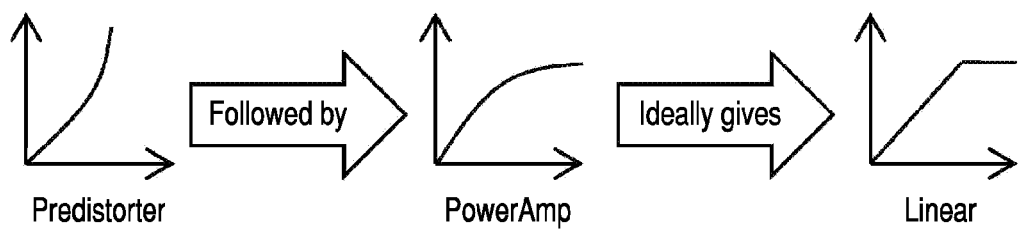
FIG. 2 illustrates a predistortion linearization system gain.

In communication systems using non-constant amplitude signaling, predistortion is a technique that achieves near-linear amplifier performance while actually operating in a more efficient gain-compressed region. The predistorter is a filter whose gain is expansive, or increases as a function of the input signal amplitude. FIG. 2 illustrates predistortion (linearization) system gain. By matching the gain-expansive predistorter to the gain-compressive characteristics of the amplifier, a nearly linear system up to maximum amplifier output power can be created as shown in FIG. 2.

Predistortion is used to extend the effectively linear region of an amplifier by a few decibels and thus allow operation at higher, more efficient, power levels. A standard amplify-and-forward distributed estimation algorithm requires that the entire signal and noise distribution be located within the linear range of the amplifier. If the signal or noise distribution has a large region of support, even a linearized class AB amplifier will often be operating at a point where the input is so small as to not be clipped. When not clipping, the amplifier is effectively operating in the inefficient class A mode of operation.

An algorithm using the nonlinear and slowly compressing behavior of the amplifier can be used to attain higher efficiency while still maintaining estimation accuracy. By using predistortion to fit all sensor amplifiers to a known soft compression function, it is possible to remove the requirement to maintain linear operation over the full signal dynamic range. What can be transmitted from each sensor is not a linear function of the measurements, such as in amplify-and-forward, but the nonlinear function to which the amplifier is now fit. By allowing some compression to occur for large amplitudes, a modest degradation in estimation accuracy is permitted for large amplitudes in order to gain more amplifier efficiency and sensor battery life. At the fusion center, a new estimation function can be used to determine the sensed value in the presence of compressive amplifier behavior.

Distributed Estimation with Amplify & Forward

In distributed estimation, noisy measurements from multiple sensors are processed in order to estimate the value of a set of parameters. The measurements of these sensors are then jointly processed in some manner to form an estimate of the single quantity they all measure. Each sensor can be self-contained, with its own power source and transmitter. Data is transmitted to a fusion center which processes the measurements of each sensor into a single estimate. For simplicity, the channels between the sensors and the fusion center are assumed to be additive white Gaussian noise (AWGN) channels.

An assumption is made that the transmitters have all been phase synchronized. Making this assumption implies that other than distributed estimation signals, there is a channel estimation system running prior to and during the sensor measurement estimation process. For that estimation to work, it is assumed that the channels and signals are slowly varying. Even with some phase error in the synchronization, reasonable estimates can be developed so this assumption is not unreasonable.

Figure 3:
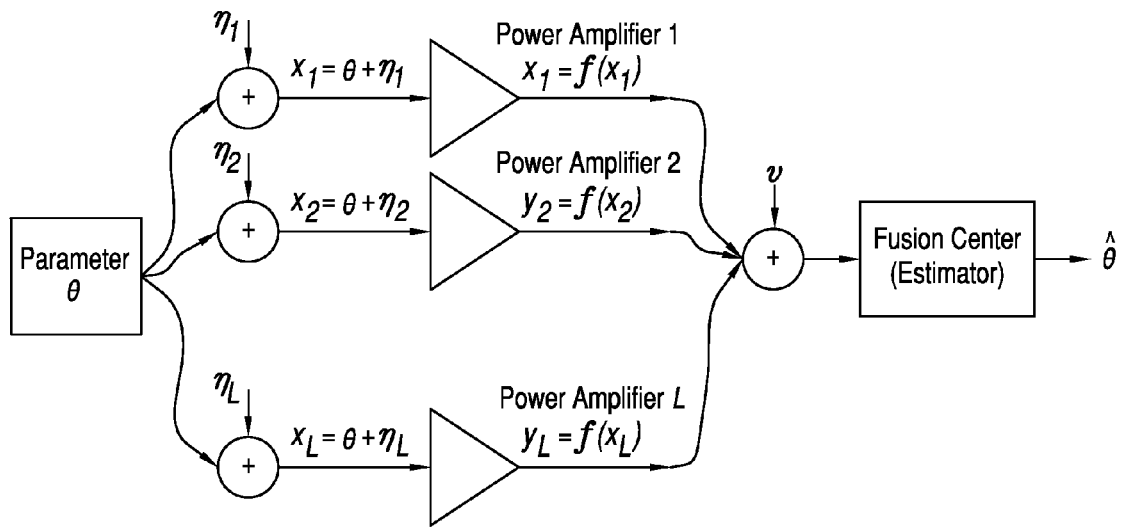
FIG. 3 illustrates a distributed estimation system topology, according to an embodiment.

FIG. 3 illustrates a distributed estimation system topology. Consider a set of L sensors, each with its own power supply transmitting over a Gaussian multiple-access channel to a fusion center as shown in FIG. 3. Each of the sensors is measuring $\theta \in \mathbb{R}^+$, in some additive noise $\eta_l$. The measurement, $x_l$, including observed noise at each sensor is:

$$x_l = \theta + \eta_l \qquad (1)$$

In some techniques, the value transmitted by the sensor l is a perfectly scaled version of the noisy sensor measurement a $x_l$, where $a \in \mathbb{R}^+$ is a hardware-determined constant determining the largest gain factor of the input signal range that can be applied while keeping the amplifier linear. The received signal is a sum of the transmitted signals from each sensor, subject to some receiver noise, V.

$$y = \sum_{l=1}^{L} ax_l + v. \qquad (2)$$

At the receiver, this is scaled by the number of sensors to provide:

$$z = \frac{1}{L}y = \frac{1}{L}\sum_{l=1}^{L} ax_l + \frac{v}{L}. \qquad (3)$$

Evaluating the limit of z as $L \to \infty$ gives the asymptotic approximation, $\zeta(\theta)$, of the value received z as the number of sensors becomes large $$\zeta(\theta) = \lim_{L \to \infty} z_L = \lim_{L \to \infty}\left(\frac{1}{L}\sum_{l=1}^{L} ax_l\right). \qquad (4)$$

In equation 4, the receiver noise v is ignored due to the assumption that as the number of sensors transmitting, L, becomes large, the received power from the sensors becomes much greater than the fusion center's receiver noise floor.

The asymptotic mean of received value $\zeta(\theta)$ as $L \to \infty$ is subject to variation induced by the random sensor measurement noise. It is useful to develop an estimate of the expected value received given the sensor noise distributions.

$$\bar{\zeta}(\theta) = E[\zeta(\theta)] = a\int_\eta f(\eta)\left(\theta + \frac{1}{L}\sum_{l=1}^{L}\eta_l\right)d\eta \qquad (5)$$

The sum term from equation 5 can be simplified using the central limit theorem, provided each sensor noise has similar distribution and is of zero mean and defined variance, to obtain $\bar{\zeta}(\theta)$, the asymptotic mean of the received value for a given actual parameter $\theta$.

$$\bar{\zeta}(\theta) = E[\zeta(\theta)] = a\theta. \qquad (6)$$

Although the estimator with uniform sensor noise, perfect channel-state information (CSI), and linear amplifiers can be found using a conventional means, a more general approach can be used to develop the estimator for smallest variance for a received signal in Gaussian noise. The estimator with smallest variance is found by solving the minimization problem in equation 7 utilizing the actual observed received value, z, and the expected asymptotic mean and variance of received signal z, given by $\bar{\zeta}(\theta)$ and $\Sigma(\theta)$ respectively:

$$\hat{\theta} = \underset{\theta}{\operatorname{argmin}}((z - \bar{\zeta}(\theta))\Sigma^{-1}(\theta)(z - \bar{\zeta}(\theta))). \quad (7)$$

Due to the asymptotic normality of $\hat{\theta}$, $\sqrt{L}(z-\bar{\zeta}(\theta))$ in equation 7 is Gaussian distributed. Using the central limit theorem, the variance of the received value $\Sigma(\theta)$ asymptotically converges to:

$$\Sigma(\theta) = a^2 \sigma_\eta^2. \quad (8)$$

Using equation 8, the value of $\Sigma(\theta)$ can be evaluated for either the Gaussian or uniform distributed sensing noise by substituting the value of variance, $\sigma_\eta^2$, appropriate for that distribution. This yields the values:

If $\eta_i \sim \mathcal{N}(0,\sigma^2) \rightarrow \Sigma(\theta) = a^2\sigma^2$, If $\eta_i \sim U(-b,b) \rightarrow \Sigma(\theta) = a^2 b^2/3 \quad (9)$ Solving equation 7 utilizing either the Gaussian or uniform distribution yields an identical result:

$$\hat{\theta} = \frac{z}{a}. \quad (10)$$

The asymptotic variance of the optimal estimate in equation 10 can be calculated as:

$$AsVar(\hat{\theta}) = \frac{\Sigma(\theta)}{\left(\frac{\partial(\bar{\zeta}(\theta))}{\partial \theta}\right)^2}, \quad (11)$$

resulting in:

If $\eta_i \sim \mathcal{N}(0,\sigma^2) \rightarrow AsVar(\hat{\theta}) = \sigma^2$, If $\eta_i \sim U(-b,b) \rightarrow AsVar(\hat{\theta}) = b^2/3. \quad (12)$ From equation 12, it can be seen that in the absence of receiver noise and channel noise, if the sensor measurement noise is distributed in such a manner that the central limit theorem can be applied, the estimate has asymptotically the same variance as the quantity being measured.

Using Cauchy distributed sensor measurement noise yields an undefined mean and variance. Consequently the reference amplify-and-forward schemes do not work for sensors with Cauchy distributed noise. This is because the conventional amplify-and-forward technique implicitly computes the sample mean of the sensor observations via equation 3. For heavy-tailed distributions such as the Cauchy distribution, the sample mean does not produce a meaningful value.

In contrast, the algorithm described below provides accurate estimates in the presence of nonlinear amplifiers. It also provides consistent estimates with Cauchy distributed sensing noise, while linear amplifiers do not.

Amplifier Characteristics and Predistortion

Amplifier Operating Classes and Modeling

Although assuming perfectly linear amplifiers makes equations 3 and 4 tractable for implementing distributed estimation and developing bounds on the variance of the attained estimate, it imposes harsh constraints on physically realizing the system in power constrained environments. In amplifier design, a design tradeoff exists between linearity and efficiency. One common metric for amplifier efficiency is called power-added efficiency (PAE). PAE is defined as the ratio between signal power out and the sum of signal power and supply power into the amplifier:

$$PAE = \frac{P_{signalOut}}{P_{supplyIn} + P_{signalIn}}. \quad (13)$$

Radio frequency amplifiers with high linearity commonly use class A amplifiers operating within a narrow region of their bias. Class A amplifiers have theoretical PAE of up to 50% percent at maximum unclipped output power, and get much more inefficient when operating at lower power levels that may be required based on the dynamic range. Greater efficiency can be attained in class AB operation. Class AB operation is attained by increasing the input signal amplitude, until some portion of the transmitted signal is clipped by the limits of the amplifier. Such operation boosts PAE but allows decreases in the gain at high input powers. Traditional amplify-and-forward estimation techniques assume the entire range of noisy sensor measurements is within the linear "class A" range of the amplifier, but this implies operating the amplifier at very low efficiency. By designing an estimation algorithm that accommodates gain compression, the increased efficiency can be used to extend sensor battery life. The major drawbacks of developing an algorithm to allow amplifier operation in the gain compression region are the introduction of nonlinearities into the estimation process and ensuring the compression behavior is the same across all sensor amplifiers.

Figure 4:
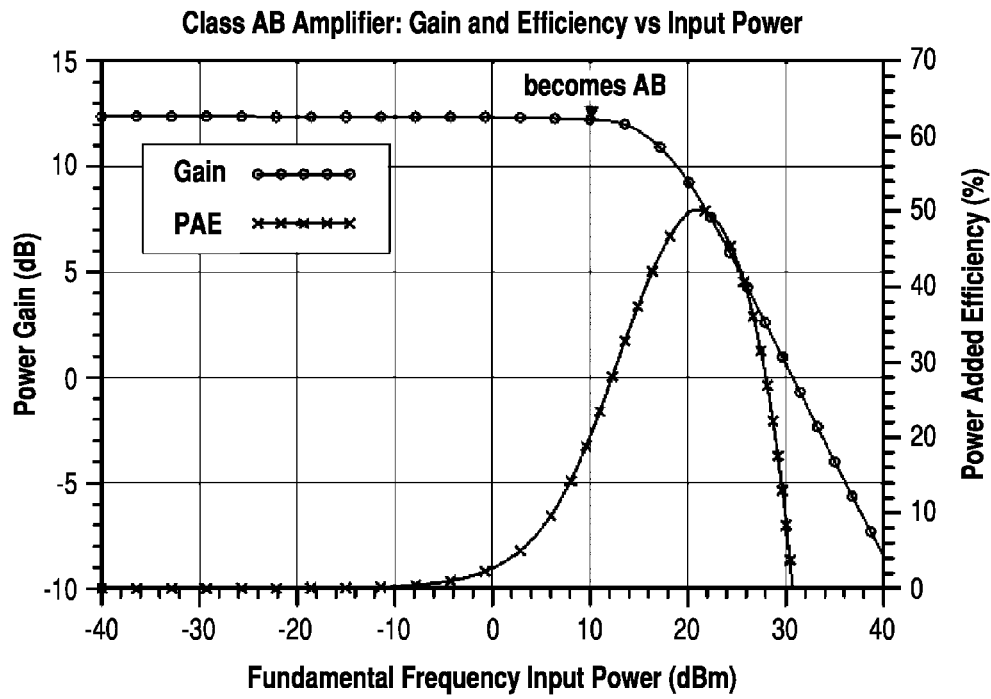
FIG. 4 illustrates a Class AB amplifier in which power added efficiency peaks when gain compression is present, but in which the amplifier is not yet saturated.

Most of analytical models for power amplifiers involve fitting the amplifier to a reduced Volterra series or a neural network. Other models are available which pay more attention to the amplifier's compression characteristics. FIG. 4 illustrates a Class AB amplifier in which the PAE peaks when gain compression is present, but in which the amplifier is not yet saturated. The Cann model has a parameter to control sharpness of the gain curve "knee", shown in FIG. 4 where the amplifier enters the class AB region. An analytically convenient and common model for soft saturation is the hyperbolic tangent function. Other fitting models can be used with this technique, which can involve a cost of increased analytical complexity.

Predistortion Algorithms

In digital predistortion, the output of the amplifier is monitored and by comparing these to the desired values, an adaptation algorithm can be used to modify the predistortion function such that actual outputs match the values intended to be transmitted accounting for the expected process, voltage, and temperature (PVT) variation. Two of the methods used for digital predistortion include gain-based look-up-table (LUT) and neural network techniques.

To force the power amplifier compression to operate as a predictable, tractable, but nonlinear function of the input amplitude from the sensor, a predistortion algorithm is used. Forcing amplifiers to fit a soft-saturation function with similarly sharp knee, and thus compressing the signal dynamic range in a consistent manner enables the benefits of operating amplifiers in their high efficiency regions. The cost paid to attain these benefits is a mild increase in estimate variance for some distributions and a higher sensitivity to receiver noise, as shown described below. In some embodiments, a soft saturation also permits operation with only an increase in variance when low probability sensor measurements exceed the anticipated sensor range, where conventional amplify-and-forward fails. The tractable soft saturation function selected for the algorithm can be a scaled hyperbolic tangent, a common model for power amplifiers. It is also numerically convenient for solvers due to its smaller derivatives when compared to sharper transition models. The primary technique used for amplifier predistortion was the gain-based look-up-table technique. An additional technique utilizing a neural network has also been used to eliminate the artifacts resulting from look-up-table segmentation.

Figure 5:
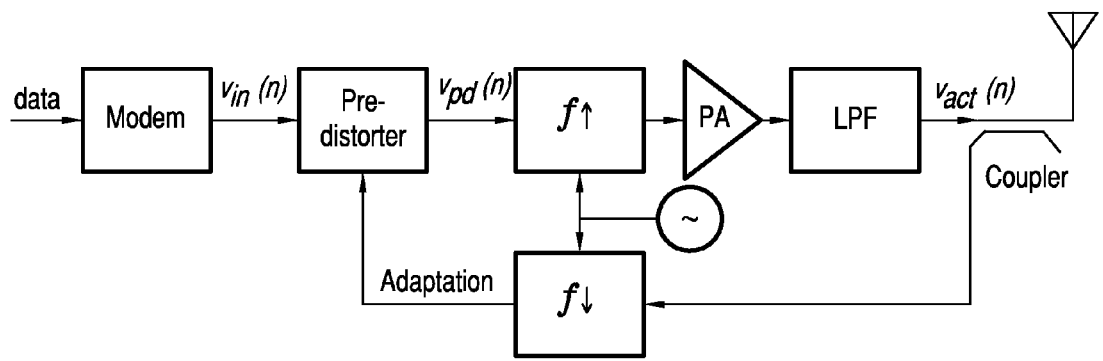
FIG. 5 illustrates a conventional predistortion system having a conventional configuration of a predistorter and an amplifier.

The predistortion technique utilized can adapt a predistorter not to produce a constant linear gain, but rather to produce a known nonlinear function. FIG. 5 shows a typical predistortion system, with a typical configuration of a predistorter and an amplifier.

Gain Based Look-Up-Table Predistortion

The gain-based predistorter can compensate for variable amplifier gain at the fundamental signal frequency. This topology is based on two assumptions. First, it assumes compression occurs primarily as a result of input power. Second, it assumes adjacent input power levels have highly similar power amplifier complex gains. Consequently, sensor outputs are assigned look-up-table (LUT) bins based on their input power level. The exact method used for allocation of these bins is discussed in K. J. Muhonen, M. Kavehrad, and R. Krishnamoorthy, "Look-up table techniques for adaptive digital predistortion: a development and comparison," *IEEE Transactions on Vehicular Technology*, vol. 49, no. 5, pp. 1995-2002, 2000.

Each bin has a correction factor which scales the sensor output, with the intent of bringing the combined gain of the predistorter and the nonlinear amplifier to the total desired gain. The correction factors are learned via the least-mean squares (LMS) gradient descent algorithm. It is assumed that increasing the correction factor magnitude increases the output magnitude of the amplifier, so that the amplifier's output is monotonically increasing with output power.

Figure 6:
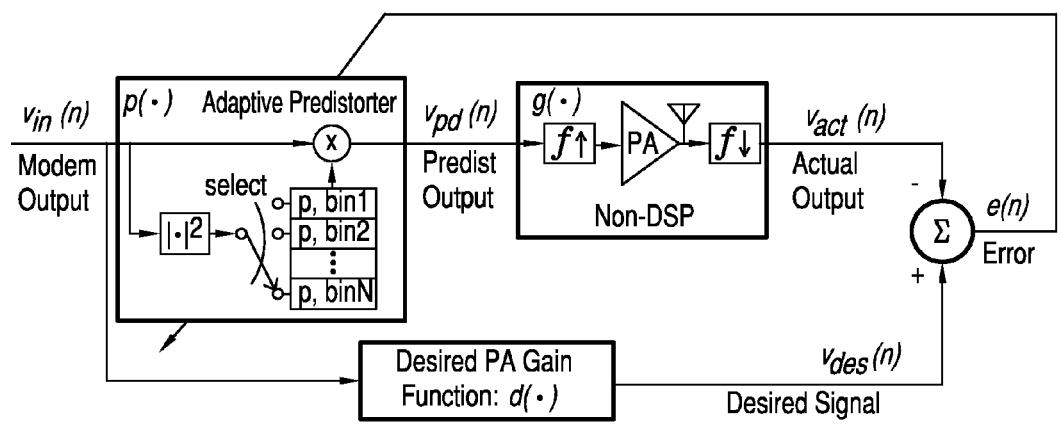
FIG. 6 illustrates a system diagram for a gain-based predistortion system, according to another embodiment.

In the implementation of the proposed gain-based predistorter, the desired value can be scaled hyperbolic tangents rather than linearization, and the choice of a linear LMS convergence algorithm can be used instead of secant-based algorithm. A basic system diagram for gain-based predistortion system is shown in FIG. 6.

For a given bin, the error, e(n), can be found by finding the difference between the actual signal transmitted, $v_{act}(n)$, and the desired signal, $v_{des}(n)$ according to:

$$e(n) = v_{des}(n) - v_{act}(n) \quad (14)$$

$$= d(v_{in}(n)) - g(p(n)v_{in}(n)) \quad (15)$$

where actual amplifier gain is g(•), predistorter gain is p(•), and the desired gain resulting from the soft-saturation function is d(•).

The error, e(n), the current predistortion correction factor for input points within the corresponding bin, $p_{bin}(n)$, and the input value $v_{in}(n)$, can then be used to compute an updated correction factor $p_{bin}(n+1)$ according to the LMS algorithm:

$$p_{bin}(n+1) = p_{bin}(n) + 2\mu e(n) v^*_{in}(n) \quad (16)$$

Many different customizations can be made to the LUT technique to aid with modeling accuracy given specific nonlinear characteristics, memory effects, or to improve learning time in the presence of significant loop delay.

Neural Network Based Predistortion

From FIG. 5, it can be determined that if the predistorter has function p(n) and the combination of upconverter and power amplifier have function g(n), then the following relationships hold:

$$v_{act}(n) = g(v_{pd}(n)) = g(p(v_{in}(n))). \quad (17)$$

If trying to make $v_{act}(n)$ a predetermined function of input voltage, the following substitutions can be made:

$$v_{act}(n) = d(v_{in}(n)). \quad (18)$$

Solving equation 17 for $v_{in}(n)$ and substituting back into equation 18 yields:

$$v_{act}(n) = g(p(d^{-1}(v_{act}(n)))). \quad (19)$$

Applying the inverse of function g to each side of equation 19 yields:

$$g^{-1}(v_{act}(n)) = p(d^{-1}(v_{act}(n))). \quad (20)$$

The function $d^{-1}(•)$ can be determined provided the amplifier system desired function d(•) is invertible. Furthermore, $g^{-1}(v_{act}(n))$ is the input to the amplifier, $v_{pd}(n)$, that produces output $v_{act}(n)$. The predistortion function p(•) is the function that takes as input $d^{-1}(v_{act}(n))$ and produces output $v_{pd}(n)$. When measurements of power amplifier output are available, this function can be fit using a neural network. In the specific case of a scaled hyperbolic tangent function, where $d(v_{in}(n)) = \alpha k \tan h(v_{in}(n)/k)$, $$v_{pd}(n) = p\left(k\tanh^{-1}\left(\frac{v_{act}(n)}{\alpha k}\right)\right). \quad (21)$$

Figure 7:
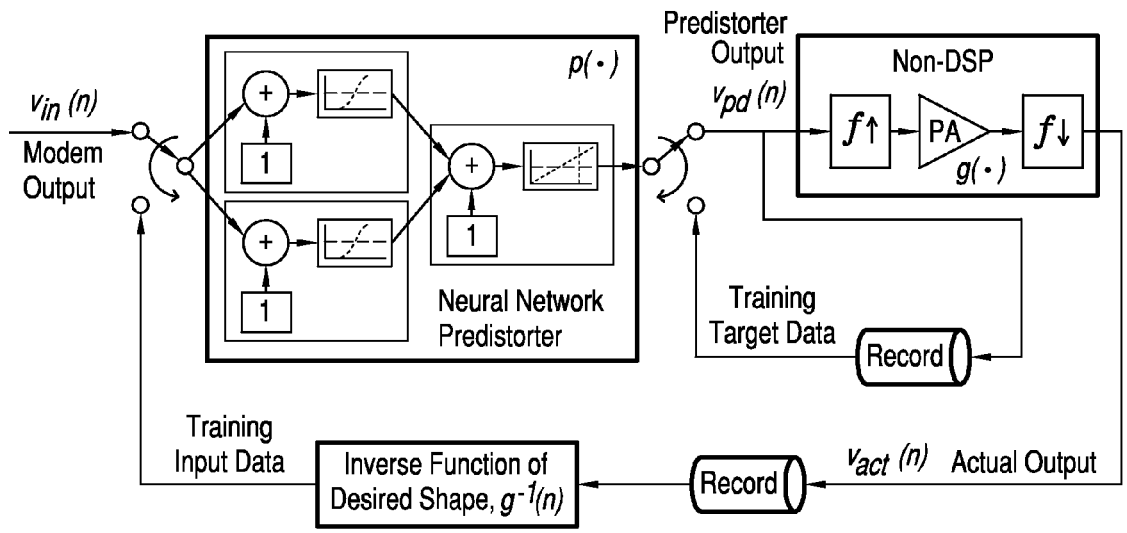
FIG. 7 illustrates a neural network-based predistortion system, according to another embodiment.

The predistortion function p(•) can be trained using a neural network with training inputs $k \arctan h(v_{act}(n)/\alpha k)$ and training outputs $v_{pd}(n)$. Such a network is numerically fit using a Levenberg-Marquadt neural network training algorithm on a neural network consisting of two layers. The first layer uses nonlinear hyperbolic tangent functions and the second layer is a single linear node. If the amplifier is known to be closely modeled by a polynomial or has memory, then higher order terms or prior inputs can also be added, while decreasing the number of neurons per layer. The resulting network topology can be seen in FIG. 7. FIG. 7 illustrates a neural network-based predistortion system.

Estimation in the Presence of Soft Compression

Transmit amplifiers can be re-biased by their power-control circuitry to provide configure both their gain and their point of maximum output power and efficiency such that after the channel losses each sensor's transmitter appears to have similar power-delivery capability. The normalized amplifier can then be predistorted to fit a hyperbolic tangent function, $$y_l = \alpha k \tanh\left(\frac{\theta + \eta_l}{k}\right), \quad (22)$$

where θ is scaled by $1/k \in \Re^+$ and the amplifier has peak output amplitude $p = \alpha k \in \Re^+$. In other embodiments, the Cann limiting amplifier model can be used.

Using techniques for distributed estimation using bounded transmissions, if a nonlinear transmitter shaping function satisfies certain criteria, a consistent estimate of θ can be attained. The criteria for this nonlinear function can ensure that if the nonlinearity, $s(\tau)$, is one-to-one and monotonic, then $\zeta(\theta)$ is also one-to-one and monotonic. The criteria are:

$s(\tau)$ is differentiable at all, $\forall \tau$;

$s(\tau)$ is bounded, $|s(\tau)| \leq c$, $\forall \tau$;

$\lim_{|\tau| \to \infty} |s(\tau)| \to c$;

$s(\tau)$ is monotonic in $\tau$.

The scaled hyperbolic tangent function in equation 22 that approximates the shape the transmitter with limited predistortion satisfies all of these mathematical requirements, with $c = \alpha k$.

The expectation of received value can be calculated by:

$$\zeta(\theta) = E[\zeta(\theta)] = \int_{\eta_i} f(\eta_i) s(\theta + \eta_i) d\eta_i, \qquad (23)$$

and the variance of the expected received value can be calculated:

$$\Sigma(\theta) = \int_{\eta_i} f(\eta_i) s^2(\theta + \eta_i) d\eta_i - \overline{\zeta}^2(\theta). \qquad (24)$$

Starting with a uniform distribution of sensing noise ranging between $-b$ and $+b$, it can be found at the receiver:

$$\overline{\zeta}(\theta) = \int_{-b}^{b} \frac{\alpha k}{2b} \tanh\left(\frac{\theta + \eta_i}{k}\right) d\eta_i \qquad (25)$$

$$= \frac{k^2 \alpha}{2b} \ln\left(\cosh\left(\frac{b+\theta}{k}\right) \operatorname{sech}\left(\frac{b-\theta}{k}\right)\right)$$

The estimate $\hat{\theta}$ can be found by replacing the expected receiver value $\overline{\zeta}(\theta)$ with the actual received value z and replacing actual $\theta$ with the estimate $\hat{\theta}$, then solving for $\overline{\theta} \in \mathfrak{R}^+$. Defining constant $m = \exp(2bz/(\alpha k^2))$, and for $z \in [0, \alpha k]$:

$$\hat{\theta} = k \cosh^{-1}\left(\frac{\sinh\left(\frac{b}{k}\right)(1+m)}{\sqrt{2m \cosh\left(\frac{2b}{k}\right) - 1 - m^2}}\right). \qquad (26)$$

It should be noted here that the estimate in equation 26 is the same solution to the optimization problem in equation 7, and the condition for equation 26, $z \in [0, \alpha k]$, is satisfied almost surely for sufficiently large L.

The variance of the received value, $\Sigma(\theta)$, can be computed for the uniform distribution:

$$\Sigma(\theta) = \int_{-b}^{b} \frac{(\alpha k)^2}{2b} \tanh^2\left(\frac{\theta + \eta_i}{k}\right) d\eta_i - \overline{\zeta}^2(\theta) \qquad (27)$$

$$= -\frac{k^4 \alpha^2}{4b^2} \ln^2\left(\cosh\left(\frac{b+\theta}{k}\right) \operatorname{sech}\left(\frac{b-\theta}{k}\right)\right) -$$

$$\frac{k^3 \alpha^2}{2b}\left(\frac{-2b}{k} + \tanh\left(\frac{b-\theta}{k}\right) + \tanh\left(\frac{b+\theta}{k}\right)\right).$$

The asymptotic variance of the estimate from the received value can be found using equation 11 to obtain equation 28. In some embodiments, when plotted, it can be seen that the performance for a uniform distribution is only a very weak function of $\theta$ when receiver noise is 0.

$$AsV(\hat{\theta}) = \frac{-\frac{k^4 \alpha^2}{4b^2} \ln^2\left(\cosh\left(\frac{b+\theta}{k}\right) \operatorname{sech}\left(\frac{b-\theta}{k}\right)\right) - \frac{k^2 \alpha^2}{2b}\left(-2b + k\tanh\left(\frac{b-\theta}{k}\right) + k\tanh\left(\frac{b+\theta}{k}\right)\right) + \sigma_v^2}{\left(\frac{\alpha k}{2b}\left(\tan\left(\frac{b+\theta}{k}\right) + \tanh\left(\frac{b-\theta}{k}\right)\right)\right)^2} \qquad (28)$$

Examining more closely the denominator and re-arranging terms reveals a key finding equation 29, that the asymptotic variance of the estimator $\hat{\theta}$ is the variance of the received value, $\Sigma(\theta)$, divided by the square of the slope of the nonlinear shaping function. This also hints at the magnitude of sensitivity to receiver noise across $\theta$ which unlike the signal portion of z does not scale down with increasing $\theta$.

$$AsVar(\hat{\theta}) = \frac{\Sigma(\theta)}{\left(\frac{\partial (\overline{\zeta}(\theta))}{\partial \theta}\right)^2} = \frac{\Sigma(\theta)}{(s'(\theta))^2} \qquad (29)$$

For Gaussian and Cauchy sensing noise sources, equation 29 holds but the integrals cannot be easily evaluated in a closed form. Simulations showing the performance attainable with Gaussian and Cauchy sensor noise distributions are described below using numerical integration to determine asymptotic variance of the estimate.

Results

Experimental Verification of Analytical Results

To verify the proposed estimation algorithm, simulations were performed in MATLAB. Initial simulations to validate the analytical solutions of equation 25-28 were performed with uniform noise passed through perfectly predistorted amplifiers. This "perfect" predistortion was attained by using the targeted scaled hyperbolic tangent function itself as the amplifier model.

Figure 8:
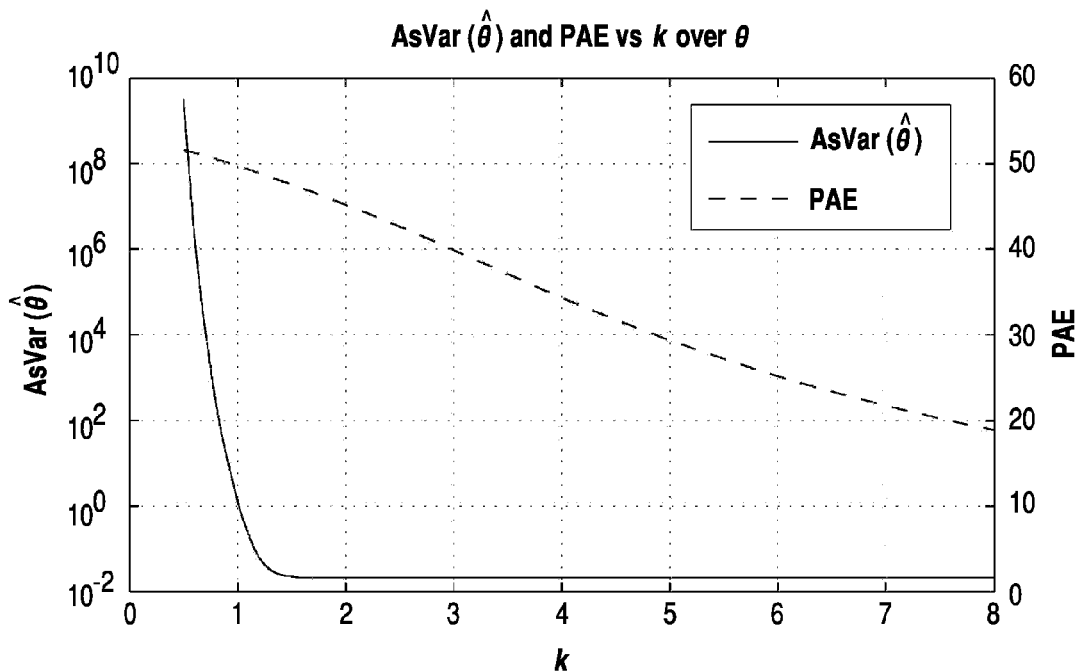
FIG. 8 illustrates AsVar($\hat{\theta}$) and PAE versus scaling k.

To determine the best values for a and k, assumptions were made about the distribution of sensor measurements being taken. It was assumed $\theta \in [0.5, 6]$ to approximate sensor measurements with just over 10 dB of dynamic range, and it was measured that a value just slightly below amplifier maximum usable output amplitude $p = \alpha k = 7.25$. To help tune the appropriate value of k, k was swept while computing AsVar($\hat{\theta}$) and PAE over $\theta$. FIG. 8 shows AsVar($\hat{\theta}$) and PAE versus scaling k. Optimal PAE is attained at smallest k where estimate variance is sufficiently small. Based on the simulation results shown in FIG. 8, it was determined k=1.75 yielded the best tradeoff between the conflicting requirements of efficiency and estimation accuracy. This left a value for $\alpha = 4.15$.

Figure 9:
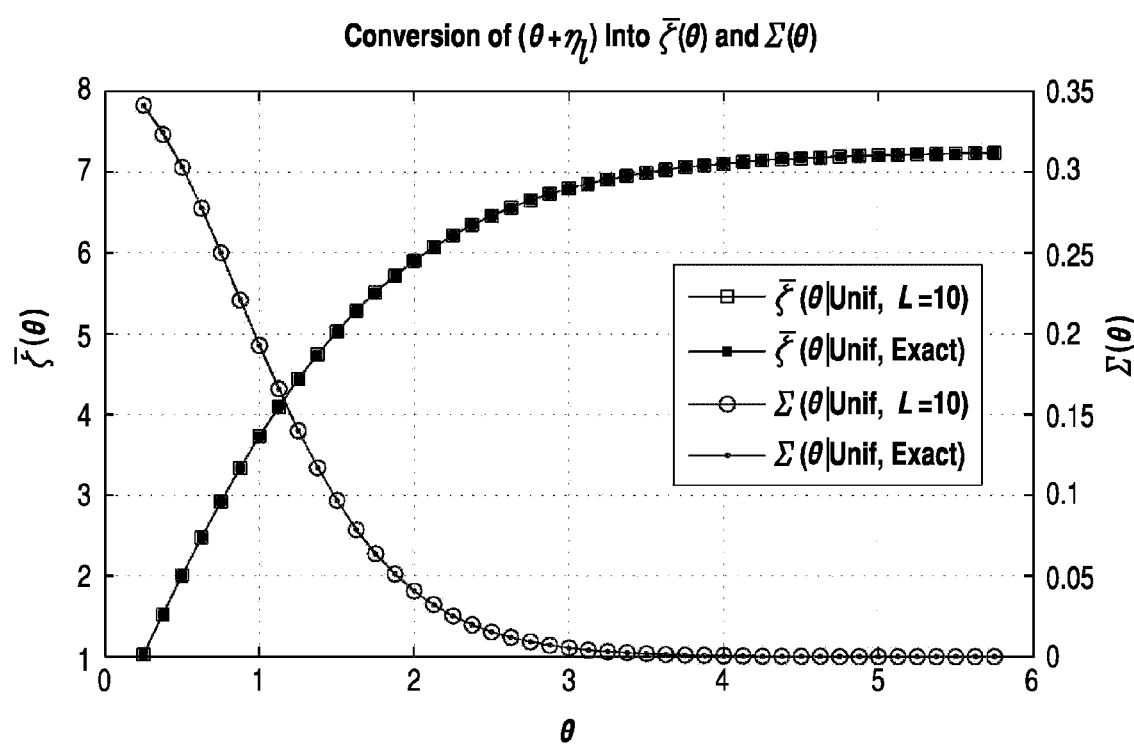
FIG. 9 illustrates $\zeta(\theta)$ and $\Sigma(\theta)$ with uniform sensor noise.

Ten sensors (L=10) were used to verify asymptotic nature of the expectations and variance in the equations in the absence of channel noise. With channel noise, a larger number of sensors such as L=1000 is required. The sensor noise source $\eta$ used for each sensor was uniformly distributed from $-b$ to $+b$ with b=0.250. The resulting simulations are shown in FIG. 9. Specifically, FIG. 9 shows $\overline{\zeta}(\theta)$ and $\Sigma(\theta)$ with uniform sensor noise. It is seen that the experimentally generated values of $\overline{\theta}(\theta)$ match the analytically determined values. Similarly, the analytically determined variance $\Sigma(\theta)$ matches the experimentally determined value L Var(z).

Comparison with Conventional Techniques

Figure 10:
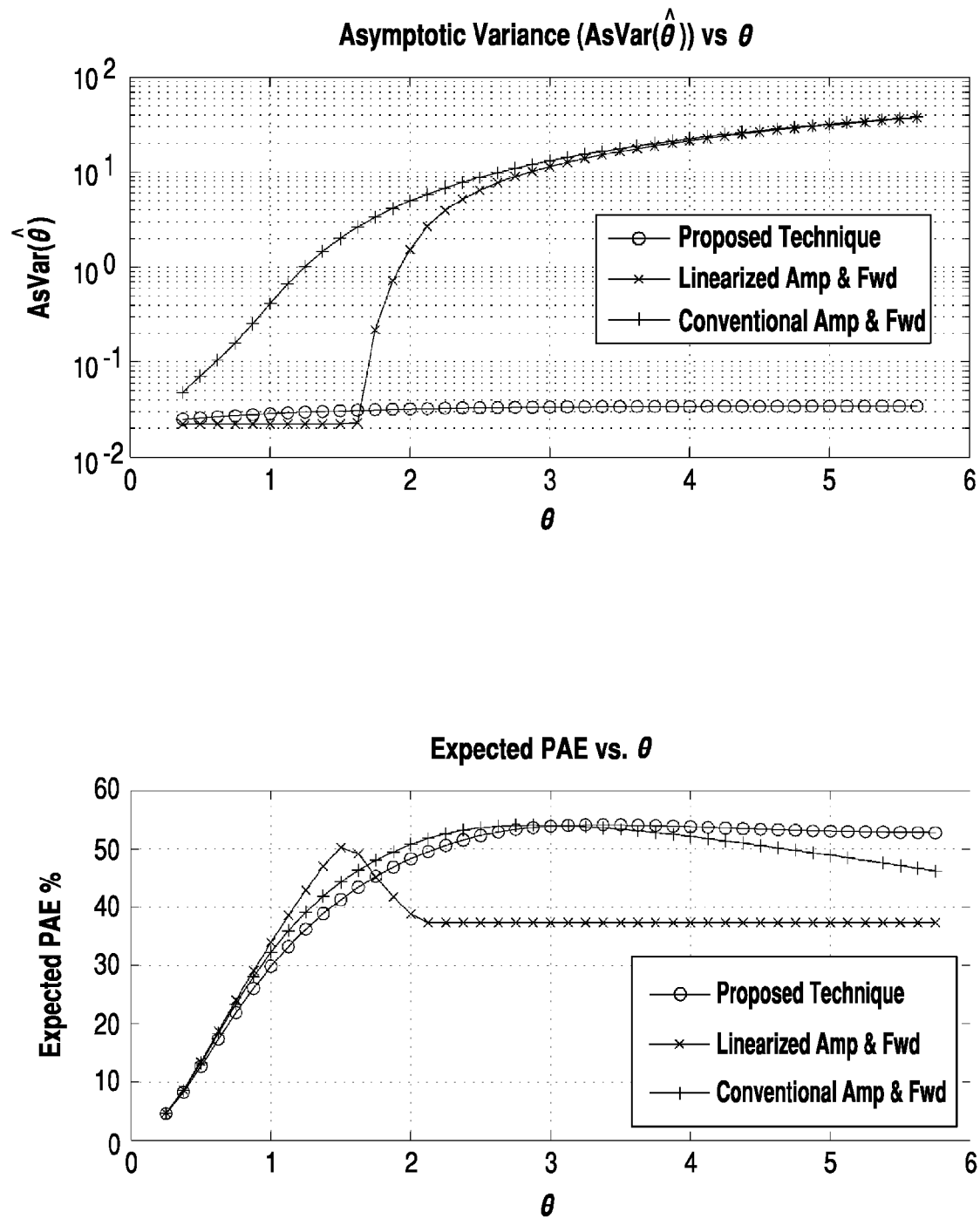
FIG. 10 illustrates performance across $\theta$ and estimation algorithm.

A major benefit of the technique described above is the ability to obtain accurate estimates while pushing further into the nonlinear region of the amplifier. The accuracy of the estimates can be determined by examining the asymptotic mean of the estimates versus θ as shown in FIG. 10. Specifically, FIG. 10 shows performance across θ and estimation algorithm. Best performance is for θ with AsVar($\hat{\theta}$) low while PAE is high. For this amplifier, it can be seen that compression starts to occur for θ>0.3. This implies that for standard amplify-and-forward estimation to work with this class AB amplifier device, that the amplitude can be kept well below maximum output power. Similarly, a perfectly linearized amplifier works well up to amplitudes of θ<1.6.

The average power added efficiency can also be calculated based on simulated data for source power and predistorter output power required to produce the desired amplifier power. Specifically, what can be seen is that range of θ capable of producing both accurate estimates, as shown in FIG. 10 (top), and maintaining high efficiency, as shown FIG. 10 (bottom), is significantly wider than made available by either the conventional or linearized amplify and forward technique.

Figure 11:
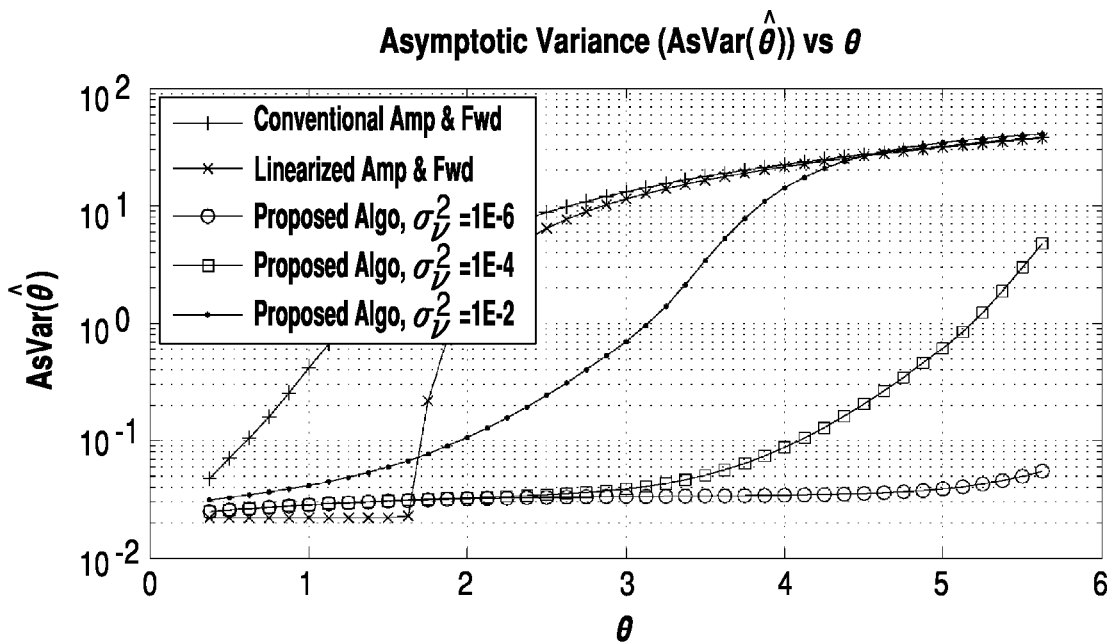
FIG. 11 illustrates asymptotic variance versus $\theta$, estimation technique, and receiver noise with different $\sigma_v^2$.

The added power efficiency resulting from operation in the nonlinear region does not come entirely for free. Namely when operating in the nonlinear region, the amplifier is more sensitive to additive receiver noise as $\partial(\bar{\zeta}(\theta))/\partial\theta$ decreases in value. Therefore, when using a system with this nonlinear predistortion, it is important to design a receiver for the fusion center that minimizes additive noise. FIG. 11 illustrates asymptotic variance versus θ, estimation technique, and receiver noise with different $\sigma_v^2$. Increasing $\sigma_v^2$ can limit the maximum θ for accurate estimates. Small $\partial(\bar{\zeta}(\theta))/\partial\theta$ when θ is large results in large $\bar{\theta}$ shifts for small changes in observed z. FIG. 11 confirms increase in the receiver noise sensitivity in simulation, though it also demonstrates good performance at large θ where conventional AF and linearized-AF have already failed.

Receiver noise is the most significant issue limiting performance in this system. Some power penalty is paid to implement a low-noise receiver, but the power penalty is smaller and more centralized than increasing the power requirements of all sensors.

Simulation for Gaussian and Cauchy Sensor Noise

Figure 12:
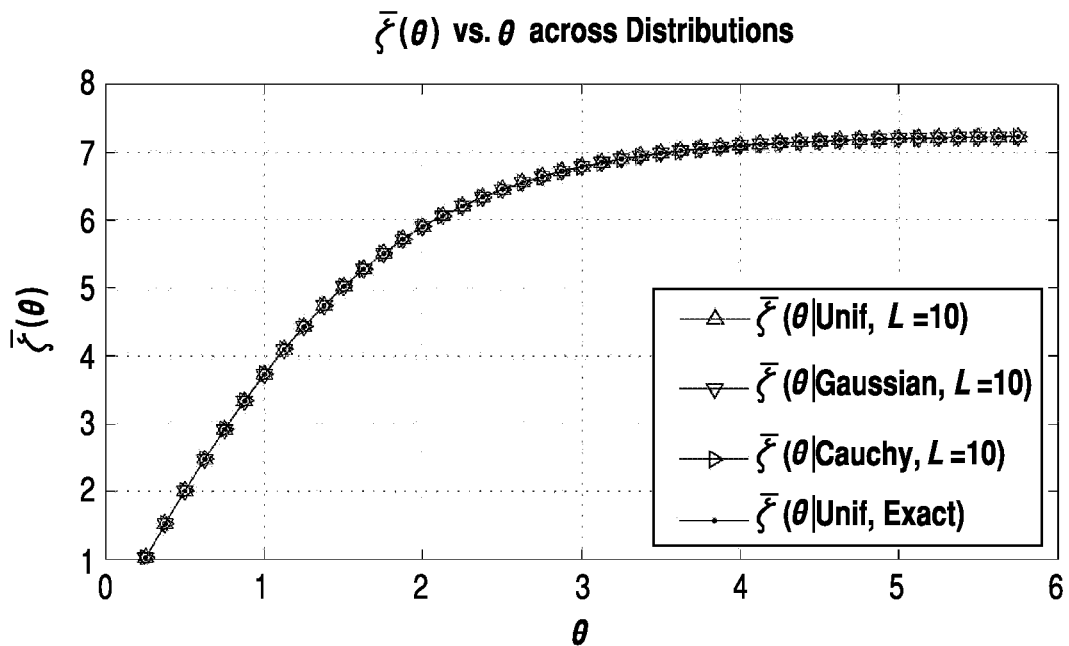
FIG. 12 illustrates $\zeta(\theta)$ for different sensor noise distributions.

To verify the performance of the estimator for non-uniform sensor noise, simulations were performed with both Gaussian and Cauchy distributed noise sources. For Cauchy distributed noise sources and conventional linear amplify-and-forward systems it was discovered that estimate means do not exist. The expected value of data at the receiver with the proposed scheme is shown in FIG. 12. Specifically FIG. 12 shows $\bar{\zeta}(\theta)$ for different sensor noise distributions. Sensor noise distribution does not induce large change in $\bar{\zeta}(\theta)$. Expectations for the Cauchy distribution had consistent means, indicating an advantage over conventional amplify-and-forward techniques. It can also be seen here that with comparable sensor noise variances, changes in observed receive value versus distribution are small. Thus, rough estimates can be attained using the analytical estimator from comparable uniformly distributed sensor noise in many cases equation 26.

Figure 13:
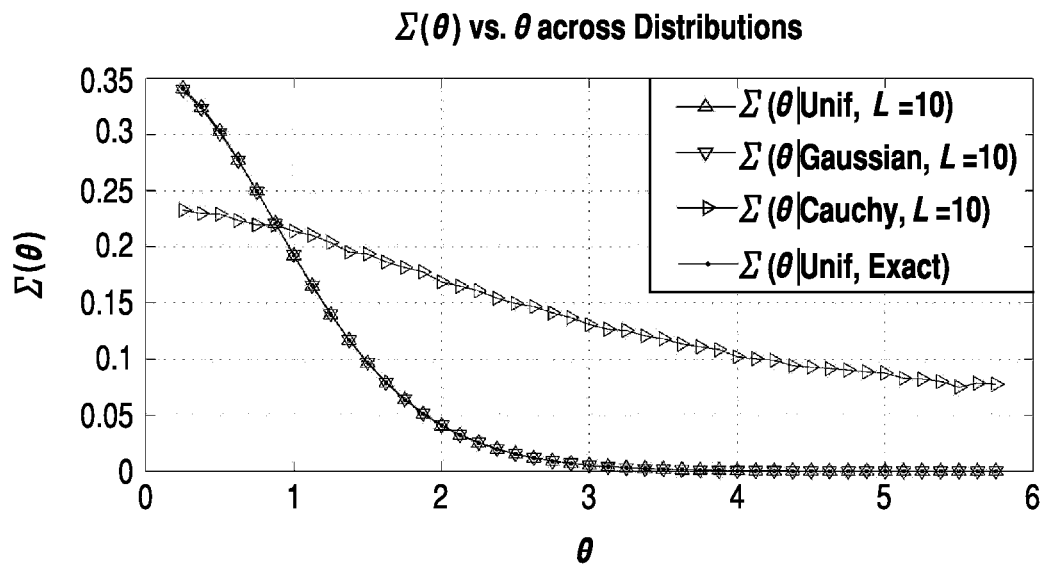
FIG. 13 illustrates $\Sigma(\theta)$ for different sensor noise distributions.
Figure 14:
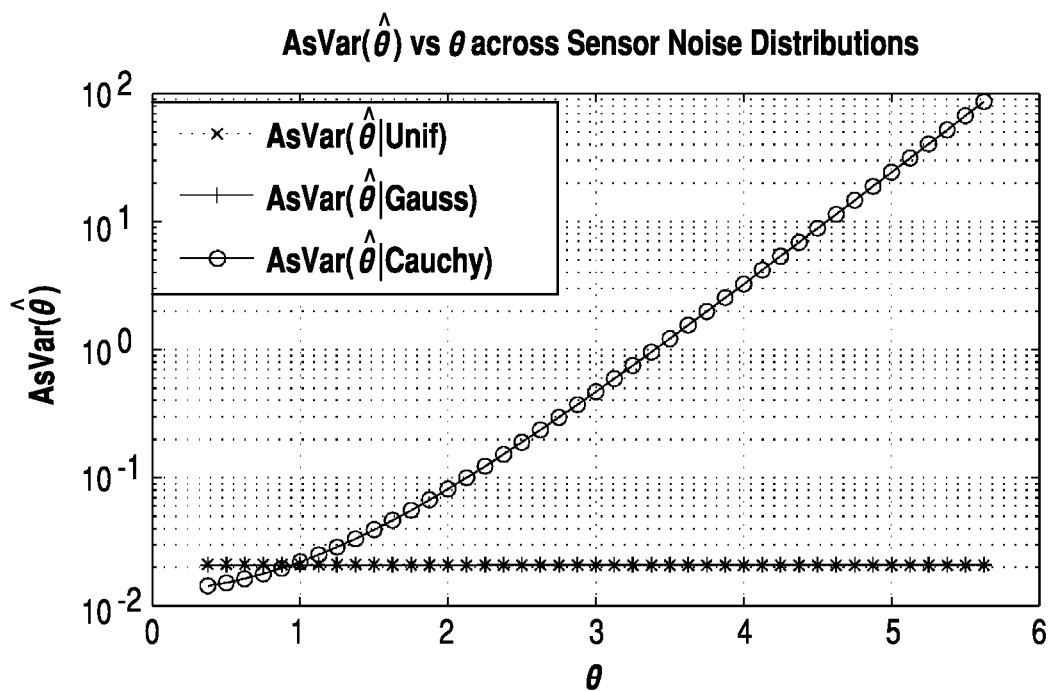
FIG. 14 shows AsVar($\hat{\theta}$) versus $\theta$ for different sensor noise distributions.

From simulations in some embodiments, it was observed that changes in $\bar{\zeta}(\theta)$ were only weakly dependent of the sensor noise distribution. As a result, its derivative $\partial(\bar{\zeta}(\theta))/\partial\theta$ is also largely similar across sensor noise distributions. Using equation 28, the estimate's asymptotic variance is determined by $\Sigma(\theta)$. Simulations were used to attain the received value variance, shown in FIG. 13. Specifically, FIG. 13 shows $\Sigma(\theta)$ for different sensor noise distributions. Sensor noise distribution does have a large effect on variance $\Sigma(\theta)$ at the FC. It can be seen that with L=10 sensors in the system, the received variance for sensors with Gaussian and uniform sensor noise distributions of equivalent variance are essentially identical. This demonstrates the assumption that as L becomes large, the central limit theorem applies. For Cauchy distributed noise, the variances are consistently decreasing with increasing θ, though not as fast as for Gaussian noise. This manifests itself as an increase in asymptotic variance with increasing θ, shown in FIG. 14. Specifically, FIG. 14 shows AsVar($\hat{\theta}$) versus θ for different sensor noise distributions. Cauchy estimates can be seen to be less accurate at larger θ than Gaussian or uniform noise distribution.

Predistortion Application & Efficient Gains

It is verified that it is possible to fit the amplifier performance to a scaled hyperbolic tangent function using predistortion, and thus extend the range of sensor values that can be successfully estimated well into the amplifier's more power efficient nonlinear class AB region of operation.

To ensure realistic amplifier performance, the amplifier model used for simulations was constructed from data attained by simulating an actual class AB power amplifier schematic in Agilent ADS. To ensure accurate modeling, amplifier input powers from −40 dBm to +40 dBm were simulated. It is assumed here that the sensor signals move slowly enough that the model can neglect amplifier memory effects. Actual gain, PAE, and power consumption were determined via table look-up on the nearest input power point. The simulated amplifier characteristics are shown in FIG. 4.

Figure 15:
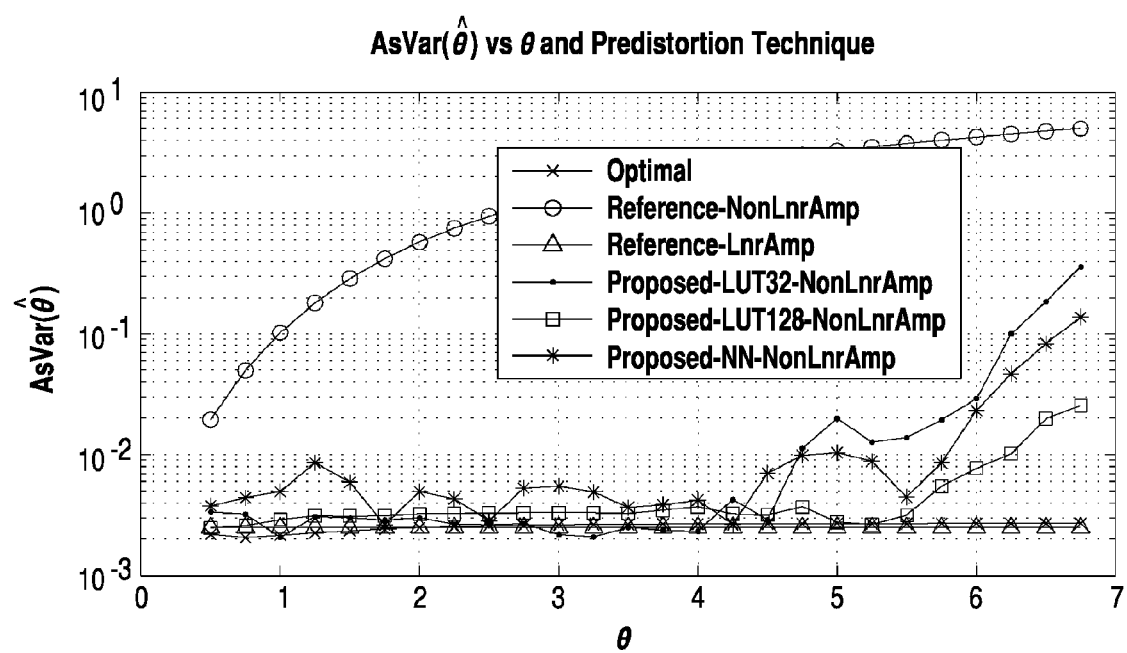
FIG. 15 shows AsVar($\hat{\theta}$) versus $\theta$.

Three different predistorter configurations were simulated. The first two configurations used the gain-based look-up-table technique, the first with 32 bins and the second with 128 bins. The third configuration used a neural network where the first layer consisted of 3 hyperbolic tangent neurons and the second layer was a single linear neuron. The performance of each predistorter implementation is shown in FIG. 15. Specifically, FIG. 15 shows AsVar($\hat{\theta}$) versus θ. Good estimates are still possible even when using realizable predistortion techniques. The predistorter imperfections manifest themselves similarly to modest receiver noise.

The algorithm described above thus can be used for amplify-and-forward distributed estimation utilizing nonlinear amplifiers. The analytical backing of the algorithms is described for uniformly distributed sensor noise. Modeling and simulation was used to validate the algorithms using simulated data from a real amplifier for both perfect and more practical methods of digital predistortion. Significant improvements in power-added efficiency were demonstrated at the cost of small amounts of additional estimation variance. The modified estimator was proven to be effective in the presence of additive receiver noise. Additionally, imperfections in realizing predistortion were shown to have similar performance degradation.

When implementing the proposed technique in a practical system it is desired to tune scaling factors α and k such that the amplifier operates in the compression region as much as possible while still attaining the desired variance. How closely to its maximum output power the amplifier can be operated, and thus how high efficiency can be increased, is dictated primarily by receiver noise variance and any additional noise added by the channel.

Thus, rather than trying to linearize the away mathematically inconvenient gain compression, it can be utilized to attain higher sensor energy efficiency. This approach can utilize the soft-limiting behavior of amplifiers to compress the dynamic range of the sensor measurements, and can avoid using the amplifier in the deep class-A region of operation. Because the amplifiers are used in a nonlinear manner, bandwidth expansion can be a problem if the sensors are measuring signals of arbitrarily high bandwidth. In some embodiments, the sensors in the network are measuring more slowly-varying physical quantities such as temperature or moisture for environmental monitoring.

Implementing and analyzing a distributed estimation system utilizing the soft-limiting behavior of can include three things: a model for the soft-limiting behavior of amplifiers, a method to ensure all amplifiers in the sensor network adhere to the behavior specified in the model across PVT variation, and an algorithm for computing and quantifying the validity of estimates based on the value received at the fusion center from the sensors. Increases in sensor power-added-efficiency are attainable in exchange for a predictable and tolerable penalty in estimate variance.

In some embodiments, the distributed estimation system can use transmitters which transmit a nonlinear function of the sensor measurement. In many embodiments, the distributed estimation system can use algorithms that construct an estimate based on the nonlinear values transmitted by the individual sensors. In various embodiments, the distributed estimation system can use sensing networks that improve transmitted efficiency by using the highly efficient nonlinear amplifier operating region. In a number of embodiments, the distributed estimation system can use predistortion to match sensors to a common nonlinear response instead of to the more common linearization.

Because power amplifiers are the major consumer of power in wireless transmitters, by enabling the amplifiers to utilize their highly-efficient nonlinear operating region, battery life can be extended significantly from sensors operating in their linear region. This modification can thus lengthen the service life of distributed systems in which the batteries are non-replaceable, such as systems with sensors in non-serviceable locations. For passively powered systems, this modification can also reduce the amount of energy that can be placed into charge storage systems. This physical layer modification to the transmitters can be compatible with existing system-level power optimization techniques, such as scheduling intermittent measurements.

Predistortion can remove the requirement that amplifier responses be inherently well matched. The matching against a common response characteristic is accomplished by the predistorter. Loosening of the matching requirement allows using of amplifiers that have been biased to different power-control dynamic ranges to compensate for known channel-gain differences. This modification thus reduces the need to have well-matched amplifiers.

Figure 16:
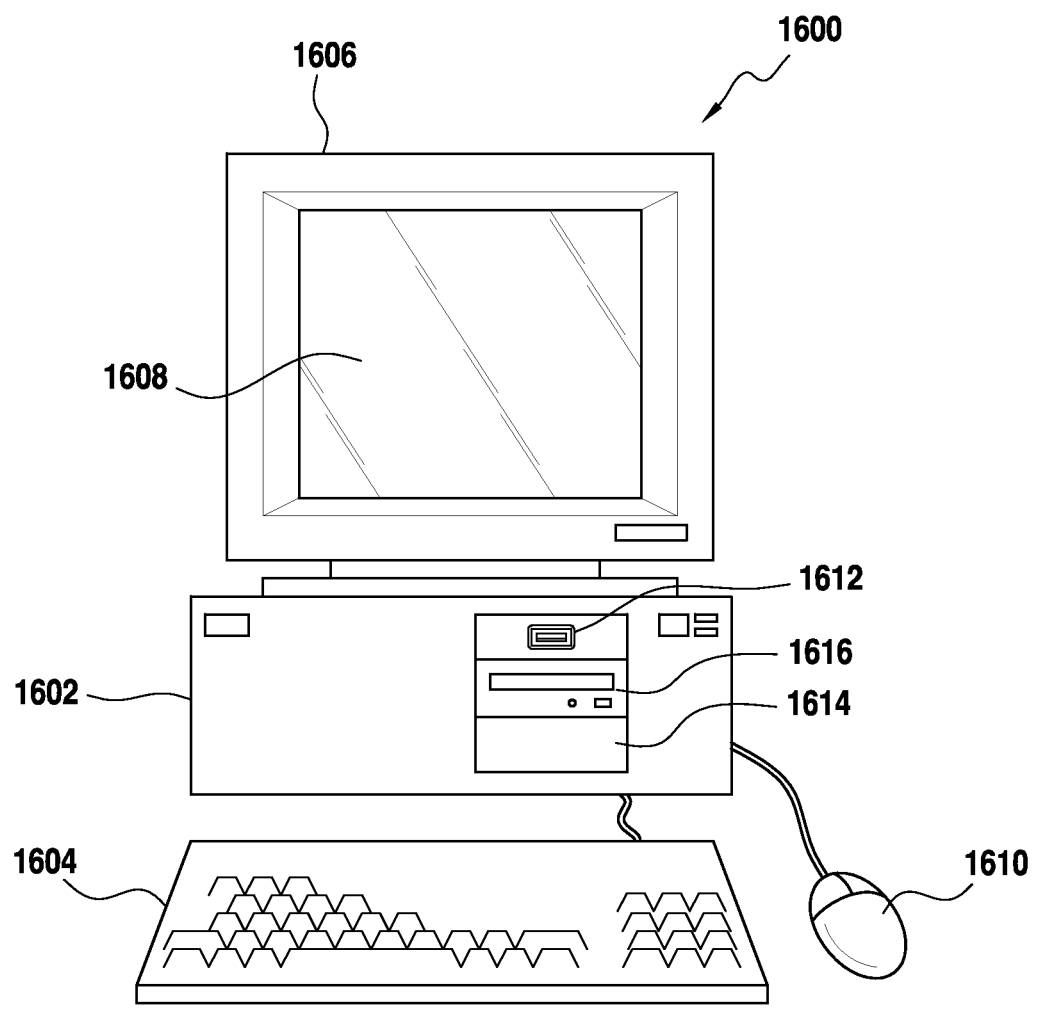
FIG. 16 illustrates a computer system that is suitable for partially or fully implementing an embodiment of the method shown in FIG. 19.
Figure 17:
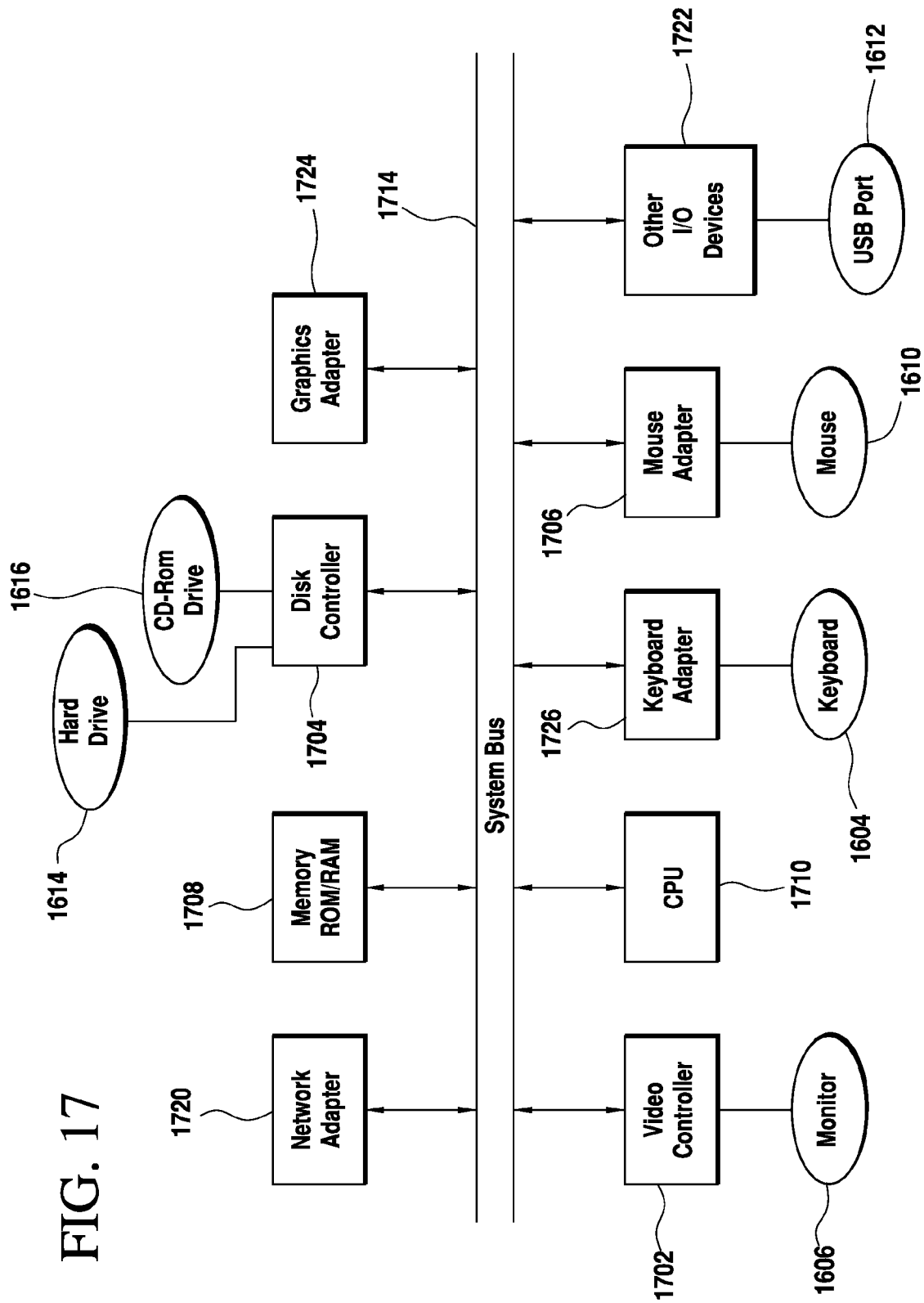
FIG. 17 illustrates a representative block diagram of an example of the elements included in the circuit boards inside a chassis of the computer system of FIG. 16.

FIG. 16 illustrates an exemplary embodiment of computer system 1600, all of which or a portion of which can be suitable for implementing the techniques described above. As an example, a different or separate one of chassis 1602 (and its internal components) can be suitable for implementing the techniques described above. Furthermore, one or more elements of computer system 1600 (e.g., refreshing monitor 1606, keyboard 1604, and/or mouse 1610, etc.) can also be appropriate for implementing the techniques described above. Computer system 1600 comprises chassis 1602 containing one or more circuit boards (not shown), Universal Serial Bus (USB) port 1612, Compact Disc Read-Only Memory (CD-ROM) and/or Digital Video Disc (DVD) drive 1616, and hard drive 1614. A representative block diagram of the elements included on the circuit boards inside chassis 1602 is shown in FIG. 17. Central processing unit (CPU) 1710 in FIG. 17 is coupled to system bus 1714 in FIG. 17. In various embodiments, the architecture of CPU 1710 can be compliant with any of a variety of commercially distributed architecture families.

Continuing with FIG. 17, system bus 1714 also is coupled to memory storage unit 1708, where memory storage unit 1708 comprises both read only memory (ROM) and random access memory (RAM). Non-volatile portions of memory storage unit 1708 or the ROM can be encoded with a boot code sequence suitable for restoring computer system 1600 (FIG. 16) to a functional state after a system reset. In addition, memory storage unit 1708 can comprise microcode such as a Basic Input-Output System (BIOS). In some examples, the one or more memory storage units of the various embodiments disclosed herein can comprise memory storage unit 1708, a USB-equipped electronic device, such as, an external memory storage unit (not shown) coupled to universal serial bus (USB) port 1612 (FIGS. 16-17), hard drive 1614 (FIGS. 16-17), and/or CD-ROM or DVD drive 1616 (FIGS. 16-17). In the same or different examples, the one or more memory storage units of the various embodiments disclosed herein can comprise an operating system, which can be a software program that manages the hardware and software resources of a computer and/or a computer network. The operating system can perform basic tasks such as, for example, controlling and allocating memory, prioritizing the processing of instructions, controlling input and output devices, facilitating networking, and managing files. Some examples of common operating systems can comprise Microsoft® Windows® operating system (OS), Mac® OS, UNIX® OS, and Linux® OS.

As used herein, "processor" and/or "processing module" means any type of computational circuit, such as but not limited to a microprocessor, a microcontroller, a controller, a complex instruction set computing (CISC) microprocessor, a reduced instruction set computing (RISC) microprocessor, a very long instruction word (VLIW) microprocessor, a graphics processor, a digital signal processor, or any other type of processor or processing circuit capable of performing the desired functions. In some examples, the one or more processors of the various embodiments disclosed herein can comprise CPU 1710.

In the depicted embodiment of FIG. 17, various I/O devices such as disk controller 1704, graphics adapter 1724, video controller 1702, keyboard adapter 1726, mouse adapter 1706, network adapter 1720, and other I/O devices 1722 can be coupled to system bus 1714. Keyboard adapter 1726 and mouse adapter 1706 are coupled to keyboard 1604 (FIGS. 16-17) and mouse 1610 (FIGS. 16-17), respectively, of computer system 1600 (FIG. 16). While graphics adapter 1724 and video controller 1702 are indicated as distinct units in FIG. 17, video controller 1702 can be integrated into graphics adapter 1724, or vice versa in other embodiments. Video controller 1702 is suitable for refreshing monitor 1606 (FIGS. 16-17) to display images on a screen 1608 (FIG. 16) of computer system 1600 (FIG. 16). Disk controller 1704 can control hard drive 1614 (FIGS. 16-17), USB port 1612 (FIGS. 16-17), and CD-ROM drive 1616 (FIGS. 16-17). In other embodiments, distinct units can be used to control each of these devices separately.

In some embodiments, network adapter 1720 can comprise and/or be implemented as a WNIC (wireless network interface controller) card (not shown) plugged or coupled to an expansion port (not shown) in computer system 1600

(FIG. 16). In other embodiments, the WNIC card can be a wireless network card built into computer system 1600 (FIG. 16). A wireless network adapter can be built into computer system 1600 by having wireless communication capabilities integrated into the motherboard chipset (not shown), or implemented via one or more dedicated wireless communication chips (not shown), connected through a PCI (peripheral component interconnector) or a PCI express bus of computer system 1600 (FIG. 16) or USB port 1612 (FIG. 16). In other embodiments, network adapter 1720 can comprise and/or be implemented as a wired network interface controller card (not shown).

Although many other components of computer system 1600 (FIG. 16) are not shown, such components and their interconnection are well known to those of ordinary skill in the art. Accordingly, further details concerning the construction and composition of computer system 1600 and the circuit boards inside chassis 1602 (FIG. 16) are not discussed herein.

When computer system 1600 in FIG. 16 is running, program instructions stored on a USB-equipped electronic device connected to USB port 1612, on a CD-ROM or DVD in CD-ROM and/or DVD drive 1616, on hard drive 1614, or in memory storage unit 1708 (FIG. 17) are executed by CPU 1710 (FIG. 17). A portion of the program instructions, stored on these devices, can be suitable for carrying out at least part of the techniques described above.

Although computer system 1600 is illustrated as a desktop computer in FIG. 16, there can be examples where computer system 1600 may take a different form factor while still having functional elements similar to those described for computer system 1600. In some embodiments, computer system 1600 may comprise a single computer, a single server, or a cluster or collection of computers or servers, or a cloud of computers or servers. Typically, a cluster or collection of servers can be used when the demand on computer system 1600 exceeds the reasonable capability of a single server or computer. In certain embodiments, computer system 1600 may comprise a portable computer, such as a laptop computer. In certain other embodiments, computer system 1600 may comprise a mobile device, such as a smart phone. In certain additional embodiments, computer system 1600 may comprise an embedded system.

Figure 18:
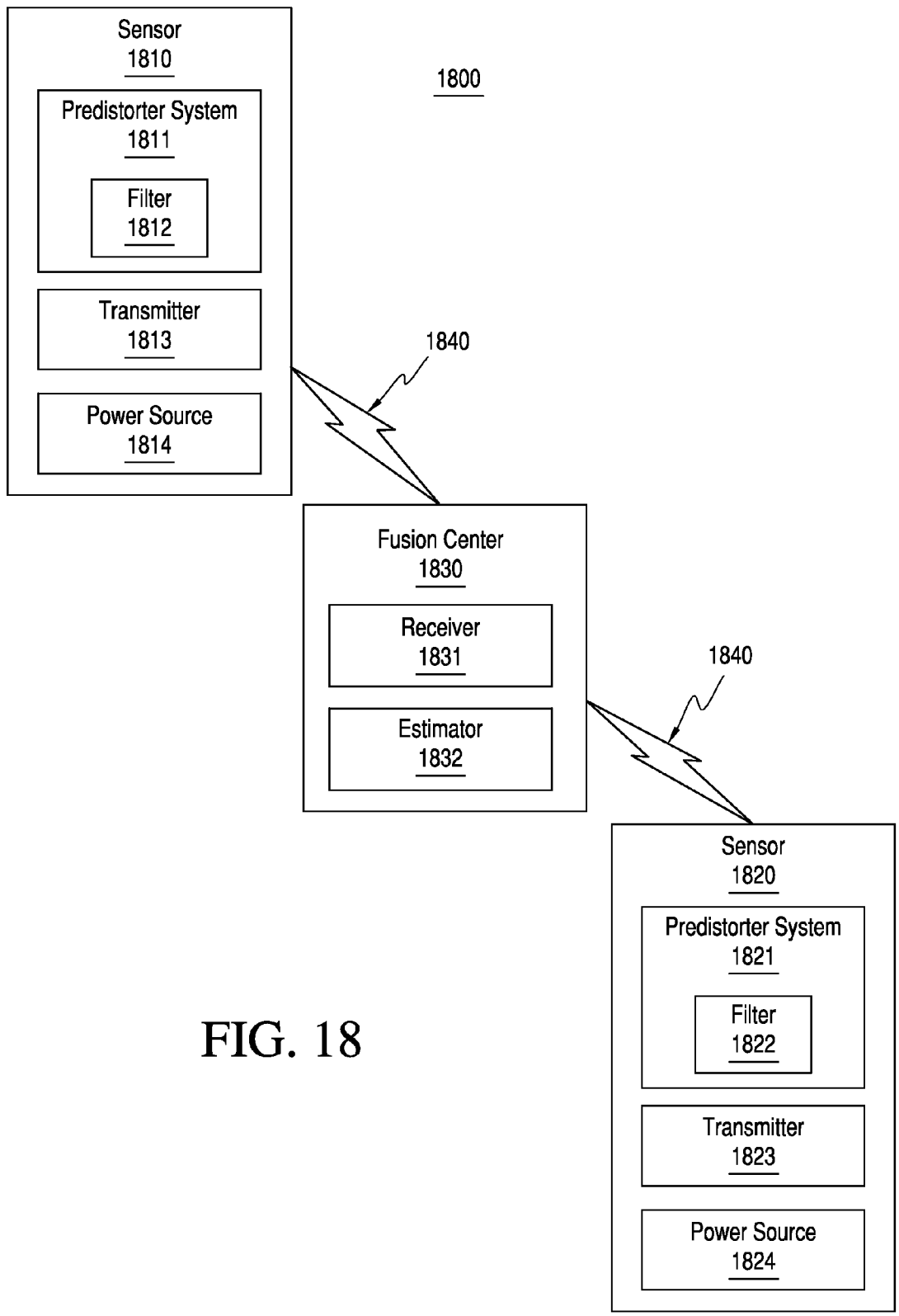
FIG. 18 illustrates a block diagram of a distributed estimation system, according to another embodiment.

Turning ahead in the drawings, FIG. 18 illustrates a block diagram of a distributed estimation system 1800, according to an embodiment. Distributed estimation system 1800 is merely exemplary and embodiments of the system are not limited to the embodiments presented herein. The distributed estimation system can be employed in many different embodiments or examples not specifically depicted or described herein. In some embodiments, certain elements or modules of distributed estimation system 1800 can perform various procedures, processes, and/or activities. In other embodiments, the procedures, processes, and/or activities can be performed by other suitable elements or modules of distributed system 1800.

In some embodiments, distributed estimation system 1800 can include a plurality of sensors, such as sensor 1810 and sensor 1820. In many embodiments, the plurality of sensors can include additional sensors, and these additional sensors can be similar or identical to sensor 1810 and/or sensor 1820. In various embodiments, each sensor, such as sensor 1810 or sensor 1820, can measure a parameter in the presence of sensing noise to detect a parameter signal, as described above. In some embodiments, the sensing noise can be Cauchy distributed, as described above. In other embodiments, the sensing noise can be Gaussian distributed, as described above. In yet other embodiments, the sensing noise can have another suitable distribution. In a number of embodiments, each sensor can include a predistorter system. For example, sensor 1810 can include predistorter system 1811, and/or sensor 1820 can include predistorter system 1821. In some embodiments, the predistorter system, such as predistorter system 1811 and/or predistorter system 1821, can be a gain-based predistorter, as described above. In other embodiments, the predistorter system, such as predistorter system 1811 and/or predistorter system 1821, can be a neural network-based predistorter, as described above. In yet other embodiments, the predistorter system, such as predistorter system 1811 and/or predistorter system 1821, can be another suitable predistorter.

In several embodiments, each predistorter system can include a filter, as described above. For example, predistorter system 1811 can include filter 1812, and predistorter system 1812 can include filter 1822. In many embodiments, each filter, such as filter 1812 or filter 1822, can have a predistortion function that can be tuned to match a gain output of the predistorter system, such as predistorter system 1811 and/or predistorter system 1821, to a nonlinear function instead of a linear gain, as described above. In a number of embodiments, the nonlinear function can be differentiable for all inputs of the nonlinear function, can be bounded by a constant for all of the inputs, can approach the constant as the inputs approach infinity, and can be monotonic. In some embodiments, the nonlinear function can be a scaled hyperbolic tangent function. In other embodiments, the nonlinear function can be a Cann limiting amplifier model function. In yet other embodiments, the nonlinear function can be another suitable nonlinear function.

In many embodiments, the nonlinear gain output of each predistorter system, such as predistorter system 1811 or predistorter system 1821, can be identical or substantially similar to each other. In a number of embodiments, each predistorter system, such as predistorter system 1811 or predistorter system 1821, can predistort the parameter signal to produce a transmission signal having a nonlinear gain.

In several embodiments, each sensor, such as sensor 1810 or sensor 1820, can include a transmitter. For example, sensor 1810 can include transmitter 1813, and sensor 1820 can include transmitter 1823. In a number of embodiments, each sensor, such as sensor 1810 or sensor 1820, can include a self-contained power source. For example, sensor 1810 can include power source 1814, and sensor 1820 can include power source 1814.

In some embodiments, distributed estimation system 1800 can include a fusion center 1830. In many embodiments, fusion center 1830 can include a receiver 1831 and/or an estimator 1832. In various embodiments, each transmitter, such as transmitter 1813 or transmitter 1823, can wirelessly transmit the transmission signal over a wireless multiple-access communication channel 1840 to receiver 1831 of fusion center 1830. The transmitter that wirelessly transmits and the predistorter that produced the transmission signal can be part of the same common sensor of the plurality of sensors. For example, transmitter 1813 can wirelessly transmit the transmission signal produced by predistorter system 1811, and transmitter 1823 can wirelessly transmit the transmission signal produced by predistorter system 1821.

In many embodiments, receiver 1831 can receive a received signal. The received signal can include an aggregation of each of the transmission signals sent by the transmitters, such as transmitter 1813 and transmitter 1823, of the sensors, such as sensor 1810 and sensor 1820, as described above. In several embodiments, estimator 1832 can convert the received signal based at least in part on an inversion of the nonlinear function used by the predistorter systems, such as predistorter system 1811 and predistorter system 1821, to produce an average parameter estimate, as described above.

Figure 19:
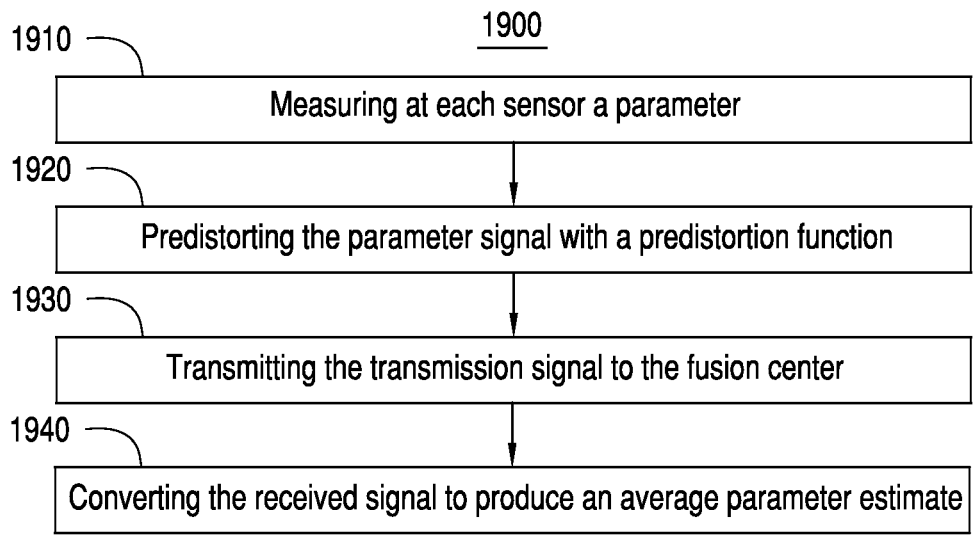
FIG. 19 illustrates a flowchart for a method of performing distributed estimation, according to another embodiment.

Turning ahead in the drawings, FIG. 19 illustrates a flow chart for a method 1900 of performing distributed estimation using a plurality of sensors and a fusion center, according to an embodiment. Method 1900 is merely exemplary and is not limited to the embodiments presented herein. Method 1900 can be employed in many different embodiments or examples not specifically depicted or described herein. In some embodiments, the procedures, the processes, and/or the activities of method 1900 can be performed in the order presented. In other embodiments, the procedures, the processes, and/or the activities of method 1900 can be performed in any suitable order. In still other embodiments, one or more of the procedures, the processes, and/or the activities of method 1900 can be combined or skipped. In some embodiments, method 1900 can be implemented by a plurality of sensors, such as sensor 1810 (FIG. 18) and sensor 1820 (FIG. 18), and a fusion center, such as fusion center 1830 (FIG. 18), and/or computer system 1600 (FIG. 16). In various embodiments, 1810 (FIG. 18), sensor 1820 (FIG. 18), and/or fusion center 1830 (FIG. 18) can include one or more components of computer system 1600 (FIG. 16).

Referring to FIG. 19, in some embodiments method 1900 can include block 1910 of measuring at each sensor of the plurality of sensors a parameter in the presence of sensing noise to detect a parameter signal. For example, sensor 1810 (FIG. 18) and sensor 1820 (FIG. 18) can each measure the parameter in the presence of sensing noise to detect the parameter signal.

Method 1900 also can include block 1920 of predistorting the parameter signal with a predistortion function that is tuned to match a gain output to a nonlinear function instead of a linear gain, to produce a transmission signal. For example, predistorter system 1811 (FIG. 18) of sensor 1810 (FIG. 18) can predistort the parameter signal with a predistortion function, as described above. Similarly, predistorter system 1821 (FIG. 18) of sensor 1820 (FIG. 18) can predistort the parameter signal with a predistortion function, as described above. In many embodiments, the nonlinear function can be differentiable for all inputs of the nonlinear function, can be bounded by a constant for all of the inputs, can approach the constant as the inputs approach infinity, and/or can be monotonic. In certain embodiments, the nonlinear function can be a scaled hyperbolic tangent function. In certain other embodiments, the nonlinear function can be a Cann limiting amplifier model function. In yet other embodiments, the nonlinear function can be another suitable nonlinear function.

Method 1900 also can include block 1930 of, for each sensor, transmitting the transmission signal from the sensor that measured the parameter, over a wireless multiple-access communication channel, to the fusion center. In some embodiments, the fusion center can receive the received signal, which can include an aggregation of each of the transmission signals sent by the plurality of sensors. For example, sensor 1810 (FIG. 18) can, after measuring the parameter, transmit a transmission signal over wireless multiple-access communication channel 1840 (FIG. 18) to fusion center 1830 (FIG. 13). Similarly, sensor 1820 (FIG. 18) can, after measuring the parameter, transmit a transmission signal over wireless multiple-access communication channel 1840 (FIG. 18) to fusion center 1830 (FIG. 13). Receiver 1831 (FIG. 18) of fusion center 1830 (FIG. 18) can receive the received signal, which can include an aggregation of the transmission signal sent by sensor 1810 (FIG. 18), the transmission signal sent by sensor 1820 (FIG. 18), and any other transmission signal sent by another sensor in the plurality of sensors.

Method 1900 also can include block 1940 of converting the received signal to produce an average parameter estimate. In a number of embodiments, converting the received signal can be based at least in part on an inversion of the nonlinear function. For example, estimator 1832 can convert the received signal to produce an average parameter estimate. The conversion can be based at least in part on an inversion of the nonlinear function used by predistorter system 1811 (FIG. 18) of sensor 1810 (FIG. 18) and by predistorter system 1821 (FIG. 18) of sensor 1820 (FIG. 18).

Figure 20:
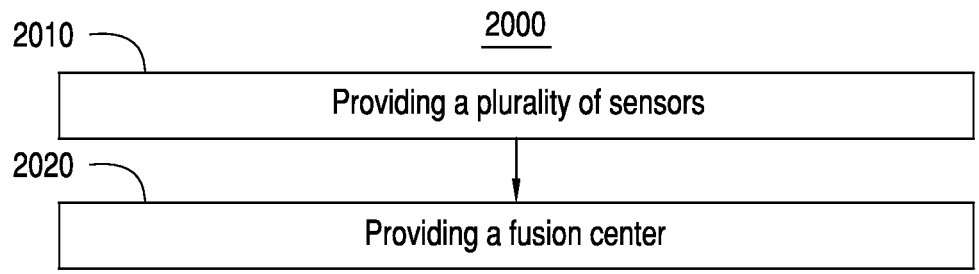
FIG. 20 illustrates a flowchart for a method of providing a distributed estimation system, according to another embodiment.

Turning ahead in the drawings, FIG. 20 illustrates a flow chart for a method 2000 of providing a distributed estimation system, according to an embodiment. Method 2000 is merely exemplary and is not limited to the embodiments presented herein. Method 2000 can be employed in many different embodiments or examples not specifically depicted or described herein. In some embodiments, the procedures, the processes, and/or the activities of method 2000 can be performed in the order presented. In other embodiments, the procedures, the processes, and/or the activities of method 2000 can be performed in any suitable order. In still other embodiments, one or more of the procedures, the processes, and/or the activities of method 2000 can be combined or skipped. In some embodiments, the distributed estimation system provided in method 2000 can be identical or similar to distributed estimation system 1800 (FIG. 18).

Referring to FIG. 20, in some embodiments method 2000 can include block 2010 of providing a plurality of sensors. In many embodiments, the sensors can be identical or similar to sensor 1810 (FIG. 18) and/or sensor 1820 (FIG. 18). In various embodiments, each sensor can include a predistorter system and a transmitter. In a number of embodiments, the predistorter system can be similar to predistorter system 1811 (FIG. 18) and/or predistorter system 1821 (FIG. 18). In certain embodiments, the transmitter can be similar to transmitter 1813 (FIG. 18) and/or transmitter 1823 (FIG. 18). In some embodiments, each sensor of the plurality of sensors can include a self-contained power source. For example, sensor 1810 (FIG. 18) can include power source 1814 (FIG. 18), and/or sensor 1820 (FIG. 18) can include power source 1824 (FIG. 18).

In some embodiments, each sensor of the plurality of sensor can measure a parameter in the presence of sensing noise to detect a parameter signal. In several embodiments, each predistorter system can include a filter having a predistortion function that is tuned to match a gain output of the predistorter system to a nonlinear function instead of a linear gain. For example, filter 1812 (FIG. 18) can have a predistortion function that is tuned to match a gain output of predistorter system 1811 (FIG. 18) to a nonlinear function. Similarly, filter 1822 (FIG. 18) can have a predistortion function that is tuned to match a gain output of predistorter system 1821 (FIG. 18) to a nonlinear function. In some embodiments, the nonlinear function can be differentiable for all inputs of the nonlinear function, can be bounded by a constant for all of the inputs, can approach the constant as the inputs approach infinity, and/or can be monotonic. In a number of embodiments, the nonlinear function can be a scaled hyperbolic tangent function. In other embodiments, the nonlinear function can be a Cann limiting amplifier model function. In yet other embodiments, the nonlinear function can be another suitable nonlinear function. In certain embodiments, the predistorter system can be a gain-based predistorter. In other embodiments, the predistorter system can be a neural network-based predistorter. In yet other embodiments, the predistorter system can be another suitable predistorter. In various embodiments, each predistorter system can predistort the parameter signal to produce a transmission signal having a nonlinear gain, as described above.

Method 2000 also can include block 2020 of providing a fusion center. In a number of embodiments, the fusion center can be identical or similar to fusion center 1830 (FIG. 18). In several embodiments, the fusion center can include a receiver and/or an estimator. In a number of embodiments, the receiver can be identical or similar to receiver 1831 (FIG. 18). In many embodiments, the estimator can be identical or similar to estimator 1832 (FIG. 18).

In many embodiments, the transmitter can wirelessly transmit the transmission signal over a wireless multiple-access communication channel to the receiver of the fusion center. For example, transmitter 1813 (FIG. 18) can wirelessly transmit the transmission signal over wireless multiple-access communication channel 1840 (FIG. 18) to receiver 1831 (FIG. 18) of fusion center 1830 (FIG. 18). The transmitter that wireless transmits and the predistorter that produced the transmission signal can be part of a common sensor of the plurality of sensors. In several embodiments, the receiver can receive a received signal. The received signal can include an aggregation of each of the transmission signals sent by the transmitters of the plurality of sensors. For example, receiver 1831 (FIG. 18) can receive a received signal, which can be an aggregation of the transmission signals sent by transmitter 1813 (FIG. 18) and transmitter 1823 (FIG. 18). In various embodiments, the estimator can convert the received signal based at least in part on an inversion of the nonlinear function to produce an average parameter estimate. For example, estimator 1832 (FIG. 18) can convert the received signal based at least in part on an inversion of the nonlinear function, used in predistorter system 1811 (FIG. 18) and/or predistorter system 1821 (FIG. 18), to produce an average parameter estimate.

Although the distributed estimation system has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that any element of FIGS. 1-20 may be modified, and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A distributed estimation system comprising:
   a plurality of sensors each comprising a predistorter system and a transmitter; and
   a fusion center comprising a receiver and an estimator, wherein:
   each sensor of the plurality of sensors measures a parameter in the presence of sensing noise to detect a parameter signal;
   each predistorter system comprises a predistorter having a non-linear gain and an amplifier having a non-linear gain;
   a total gain of each predistorter system across the predistorter and the amplifier of the predistorter system is equivalent to a predetermined nonlinear function instead of a linear function;
   each predistorter system predistorts the parameter signal to produce a transmission signal having a non-linear gain;
   each transmitter wirelessly transmits the transmission signal over a wireless multiple-access communication channel to the receiver of the fusion center, wherein the transmitter that wirelessly transmits and the predistorter system that produced the transmission signal are part of a common sensor of the plurality of sensors;
   the receiver receives a received signal, wherein the received signal comprises an aggregation of each of the transmission signals sent by the transmitters of the plurality of sensors; and
   the estimator converts the received signal based at least in part on an inversion of the predetermined nonlinear function to produce an average parameter estimate.

2. The distributed estimation system of claim 1, wherein:
   the predetermined nonlinear function is differentiable for all inputs of the predetermined nonlinear function;
   the predetermined nonlinear function is bounded by a constant for all of the inputs;
   the predetermined nonlinear function approaches the constant as the inputs approach infinity; and
   the predetermined nonlinear function is monotonic.

3. The distributed estimation system of claim 1, wherein: the predetermined nonlinear function is a scaled hyperbolic tangent function.

4. The distributed estimation system of claim 1, wherein: the predetermined nonlinear function is a Cann limiting amplifier model function.

5. The distributed estimation system of claim 1, wherein: each sensor of the plurality of sensors comprises a self-contained power source.

6. The distributed estimation system of claim 1, wherein: the predistorter system of at least one of the plurality of sensors comprises a gain-based predi storter.

7. The distributed estimation system of claim 1, wherein: the predistorter system of at least one of the plurality of sensors comprises a neural network-based predistorter.

8. The distributed estimation system of claim 1, wherein: the sensing noise is Cauchy distributed.

9. The distributed estimation system of claim 1, wherein: the sensing noise is Gaussian distributed.

10. A method of performing distributed estimation using a plurality of sensors and a fusion center, the method comprising:

measuring at each sensor of the plurality of sensors a parameter in the presence of sensing noise to detect a parameter signal;

predistorting the parameter signal with a predistorter system comprising a predistorter having a non-linear gain and an amplifier having a non-linear gain such that a total gain of the predistorter system across the predistorter and the amplifier is equivalent to a predetermined nonlinear function instead of a linear function, to produce a transmission signal;

for each sensor, transmitting the transmission signal from the sensor that measured the parameter, over a wireless multiple-access communication channel, to the fusion center, the fusion center receiving a received signal comprising an aggregation of each of the transmission signals sent by the plurality of sensors; and converting the received signal based at least in part on an inversion of the predetermined nonlinear function to produce an average parameter estimate.

11. The method of claim 10, wherein:
the predetermined nonlinear function is differentiable for all inputs of the predetermined nonlinear function;
the predetermined nonlinear function is bounded by a constant for all of the inputs;
the predetermined nonlinear function approaches the constant as the inputs approach infinity; and
the predetermined nonlinear function is monotonic.

12. The method of claim 10, wherein:
the predetermined nonlinear function is a scaled hyperbolic tangent function.

13. The method of claim 10, wherein:
the predetermined nonlinear function is a Cann limiting amplifier model function.

14. A method of providing a distributed estimation system comprising:

providing a plurality of sensors, each sensor comprising a predistorter system and a transmitter, and providing a fusion center comprising a receiver and an estimator;

wherein:
each sensor of the plurality of sensors measures a parameter in the presence of sensing noise to detect a parameter signal;
each predistorter system comprises a predistorter having a non-linear gain and an amplifier having a non-linear gain;
a total gain of each predistorter system across the predistorter and the amplifier of the predistorter system is equivalent to a predetermined nonlinear function instead of a linear function;
each predistorter system predistorts the parameter signal to produce a transmission signal having a non-linear gain;
each transmitter wirelessly transmits the transmission signal over a wireless multiple-access communication channel to the receiver of the fusion center, wherein the transmitter that wirelessly transmits and the predistorter system that produced the transmission signal are part of a common sensor of the plurality of sensors;
the receiver receives a received signal, wherein the received signal comprises an aggregation of each of the transmission signals sent by the transmitters of the plurality of sensors; and
the estimator converts the received signal based at least in part on an inversion of the predetermined nonlinear function to produce an average parameter estimate.

15. The method of claim 14, wherein:
the predetermined nonlinear function is differentiable for all inputs of the predetermined nonlinear function;
the predetermined nonlinear function is bounded by a constant for all of the inputs;
the predetermined nonlinear function approaches the constant as the inputs approach infinity; and
the predetermined nonlinear function is monotonic.

16. The method of claim 14, wherein:
the predetermined nonlinear function is a scaled hyperbolic tangent function.

17. The method of claim 14, wherein:
the predetermined nonlinear function is a Cann limiting amplifier model function.

18. The method of claim 14, wherein:
each sensor of the plurality of sensors comprises a self-contained power source.

19. The method of claim 14, wherein:
the predistorter system of each of the plurality of sensors comprises a gain-based predistorter.

20. The method of claim 14, wherein:
the predistorter system of each of the plurality of sensors comprises a neural network-based predistorter.

* * * * *